(12) United States Patent
Brunner et al.

(10) Patent No.: US 6,403,975 B1
(45) Date of Patent: *Jun. 11, 2002

(54) SEMICONDUCTOR COMPONENTS, IN PARTICULAR PHOTODETECTORS, LIGHT EMITTING DIODES, OPTICAL MODULATORS AND WAVEGUIDES WITH MULTILAYER STRUCTURES GROWN ON SILICON SUBSTRATES

(75) Inventors: Karl Brunner, Eching; Karl Eberl, Weil der Stadt, both of (DE)

(73) Assignee: Max-Planck Gesellschaft zur Forderung der WissenschafteneeV, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/835,445

(22) Filed: Apr. 8, 1997

(30) Foreign Application Priority Data

Apr. 9, 1996 (EP) .............................. 96105589

(51) Int. Cl.⁷ ........................ H01L 29/06; H01L 31/072
(52) U.S. Cl. ............................. 257/15; 257/18; 257/19; 257/21; 257/22; 257/103
(58) Field of Search ............................. 257/15, 18, 19, 257/21, 22, 103, 190

(56) References Cited

U.S. PATENT DOCUMENTS

| | | | |
|---|---|---|---|
| 3,972,749 A | 8/1976 | Pavlichenko | 148/33 |
| 4,885,614 A | 12/1989 | Furukawa et al. | 357/16 |
| 5,387,804 A | 2/1995 | Suzuki et al. | 257/77 |
| 5,523,592 A | 6/1996 | Nakagawa et al. | 257/96 |

FOREIGN PATENT DOCUMENTS

| | | |
|---|---|---|
| DE | 2345198 | 4/1974 |
| DE | 3823249 A1 | 1/1989 |
| DE | 3943232 A1 | 7/1990 |
| DE | 195 33 313 A1 | 3/1997 |
| EP | 0 595 080 A1 | 5/1994 |
| JP | 6-232488 | 8/1994 |

OTHER PUBLICATIONS

Powell, et al.,"Silicon–Germanium–Carbon Alloys Extending Si Based Heterostructure Engineering," Jpn. J. App. Phys., vol. 33, Pt. 1, No. 4B, Apr. 1994, pp. 2388–2391.

Boucaud, et al., "Structural and Optical Properties of SiGeC Alloys and Multi–Quantam Wells Grown By Rapid Thermal Chemical Vapor Deposition," Mat. Res. Soc. Symp. Proc., , vol. 379 (1995), pp. 447–452.

(List continued on next page.)

Primary Examiner—Minh Loan Tran
(74) Attorney, Agent, or Firm—Wolf, Greenfield & Sacks, P.C.

(57) ABSTRACT

A semiconductor component, selected from the group comprising a photodetector, a light emitting diode, an optical modulator and a waveguide. The semiconductor component comprises an Si substrate, an active region formed on said substrate, and an Si capping layer on said active region. In one embodiment the active region is a superlattice comprising alternating layers of $Si_{1-y}C_y$ and $Si_{1-x-y}Ge_xC_y$, with the atomic fraction y of the $Si_{1-x-y}Ge_xC_y$ layers being equal to or different from the atomic fraction y of the $Si_{1-y}C_y$ layers. In another embodiment it is a superlattice comprising a plurality of periods of a three-layer structure comprising Si, $Si_{1-y}C_y$ and $Si_{1-x}Ge_x$ layers. In a third embodiment it is a superlattice comprising a plurality of periods of a three-layer structure comprising Si, $Si_{1-y}C_y$ and $Si_{1-x-y}Ge_xC_y$ layers, with the atomic fraction y of the $Si_{1-x-y}Ge_xC_y$ layers being equal to or different from the atomic fraction y of the $Si_{1-y}C_y$ layers. The components have faborable optical and electrical properties and are suitable for integration on a Si substrate.

33 Claims, 17 Drawing Sheets

(LAYER SEQUENCE)

OTHER PUBLICATIONS

Figure 2B:
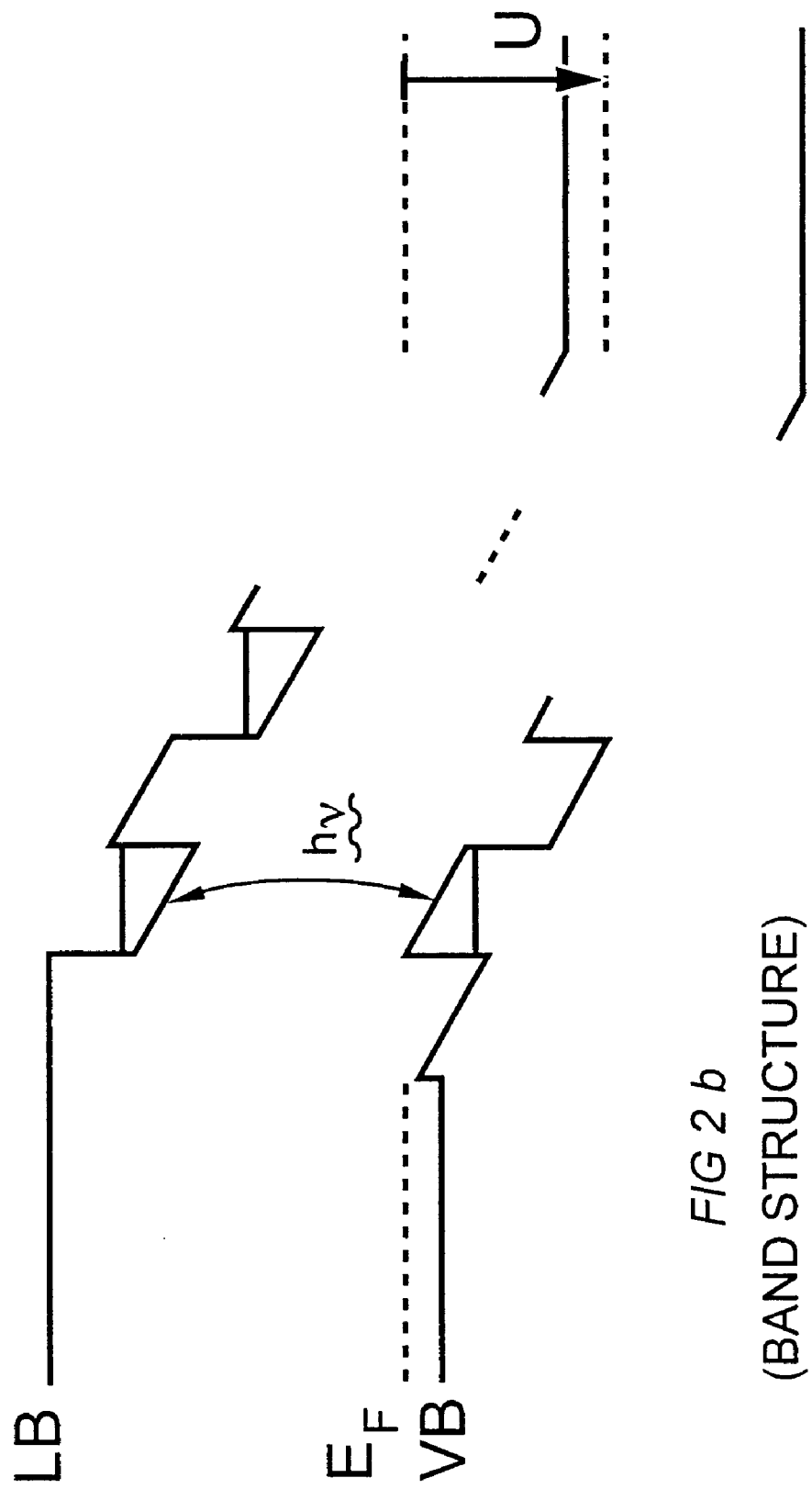

Jain, et al., "Growth and Properties of Strained Si1–x–yGexCy Layers," Semicond. Sci. Technolo. vol. 10, Oct. 1995, pp. 1289–1302.

Ismail, et al., "Identification of a Mobility–Limiting Scattering Mechanism in Modulation–Doped Si/SiGe Heterostructures," Physical Review Letters, vol. 73, No. 25, Dec. 1994, pp. 3447–3450.

Fitzgerald, et al., "Epitaxially Stabilized Gex Sn1–x Diamond Cubic Alloys,", Journal of Electronic Materials, vol. 20, No. 6 (1991), 489–501.

Wegscheider, et al., "Single–crystal Sn/Ge superlattices on Ge substrates: Growth and structural properties," App. Phys. Lett. 57, Aug. 27, 1990, pp. 875–877.

Eberl, et al., "The growth and characterization of Si1–yCy alloys on Si(001) substrate," J. Vac. Sci. Technol. B 10(2), Mar./Apr. 1992, pp. 934–936.

Rüker, et al., "Strain–Stabilized Highly Concentrated Pseudomorphic Si1–xCx Layers in Si," Physical Review Letters, vol. 72, No. 22, May 30, 1994, pp. 3578–3581.

Demkov, et al., "Theoretical Investigation of Random Si–C alloys,", Physical Review B, vol. 48, No. 4 Jul. 15, 1993, pp. 2207–2214.

Dean, et al., "New Radiative Recombination Processes Involving Neutral Donors and Acceptors in Silicon and Germanium," Physical Review, vol. 161, No. 3, Sep. 15, 1997, pp. 711–729.

Menéndez, et al., "Raman sepectroscopy study of microscopic strain in epitaxial Si1–x–yGexCy alloys," Appl. Phys. Lett. 66 (10), Mar. 6, 1995, pp. 1160–1162.

Boucaud, et al., "Photoluminescence of strained Si1–yCy alloys grown at low temperature," Appl. Phys. Lett. 66(1), Jan. 2, 1995; pp. 70–72.

Weber, et al., "Near–band–gap photoluminescence of Si–Ge alloys," Phsysical Review B, vol. 40, No. 8, Sep. 15, 1989, pp. 5683–5693.

Wachter, et al., "Photoluminescence of confined excitons in MBE–grown Si1–xGex/Si(100) single quantum wells," Thin Solid Films, 222 (1992), pp 10–14.

Eberl, et al., "Growth and strain compensation effects in the ternary Si1–x–yGexCy allow system," Appl. Phys. Lett. 60 (24), Jun. 15, 1992; pp. 3033–3035.

Boucaud, et al., "Band–edge and deep level photoluminescence of pseudomorphic Si1–x–yGexCy alloys," Appl. Phys. Lett. 64 (7), Feb. 14, 1994; pp. 875–877.

Eberl, et al., "Strain symmetrization effects in pseudomorphic Si1–yCy/Si1–xGex superlattices," Appl. Phys. Lett. 64 (6), Feb. 7, 1994; pp. 739–741.

Goorsky, et al., "Thermal stability of Si1–xCx/Si strained layer supperlattices," Appl. Phys. Lett. 60 (22) Jun 1, 1992; pp. 2758–2760.

Brunner, et al., "Near–Band–Edge Photoluminescence from Pseudomorphic Si1–yCy/Si Quantum Well Structures," Aug. 17, 1995; pp. 1–10 with figures 1–5.

Strum, et al., "Well–Resolved Band–Edge Photoluminescence of Excitons Confined in Strained Si1–xGx Quantum Wells," Physical Review Letters, vol. 66, No. 10, Mar. 11, 1991, pp. 1362–1365.

Iver, et al., "Synthesis of Si1–yCy alloys by molecular beam epitaxy," Appl. Phys. Lett. 60 (3), Jan. 20, 1992, pp. 356–358.

Soref, "Optical band gap of the ternary semiconductor Si1–x–yGexCy," J. Appl. Phys. 70 (4), Aug. 15, 1991, pp. 2470–2472.

Powell, et al., "Si1–x–yGexCy growth and properties of the ternary system," Journal of Crystal Growth 127, 1993, pp. 425–429.

English Language Search Report dated Sep. 2, 1997.

Presting et al., "Ultrathin $Si_mGe_n$ Strained Layer Superlattices—A Step Towards Si Optoelectronics," Semicond. Sci. Technol. 7 (1992), pp. 1127–1148, 1992 IOP Publishing Ltd.

Powell et al., "$Si_{1-x-y}Ge_xC_y$ Growth And Properties Of The Ternary System," Journal of Crystal Growth 127 (1993) pp. 425–429, Elsevier Science Publishers B.V.

St. Amour et al., "Defect–Free Band–Edge Photoluminescence And Band Gap Measurement Of Pseudomorphic $Si_{1-x-y}Ge_xC_y$ Allow Layers on Si (100)," 1995 American Institute of Physics, pp. 3915–3917, Appl. Phys. Lett. 67 (26), Dec. 25, 1995.

Soref, "Optical Bank Gap Of The Ternary Semiconductor $Si_{1-x-y}Ge_xC_y$," 1991 American Institute of Physics, pp. 2470–2472, J. Appl. Phys. 70(4), Aug. 15, 1991.

Sturm et al., "Well–Resolved Band–Edge Photoluminescence Of Excitons Confined In Strained $Si_{1-x}Ge_x$ Quantum Wells," 1991 The American Physical Society, Physical Review Letters, vol. 66, No. 10, pp. 1362–1365, Mar. 11, 1991.

Zachai et al., "Photoluminescence In Short–Period Si/Ge Strained–Layer Superlattices," 1990 The American Physical Society, Physical Review Letters, vol. 64, No. 9, pp. 1055–1058, Feb. 26, 1990.

Iyer et al., "Synthesis of $Si_{1-y}C_y$ Alloys By Molecular Beam Epitaxy," 1992 American Institute of Physics, pp. 356–358, Appl. Phys. Lett. 60(3), Jan. 20, 1992.

Usami et al., "Enhancement Of Radiative Recombination In Si–Based Quantum Wells With Neighbering Confinement Structure," 1995 American Institute of Physics, pp. 524–526, Appl. Phys. Lett. 67(4), Jul. 24, 1995.

Morrison et al., "Electronic And Optical Properties Of Ultrathin Si/Ge (001) Superlattices," 1988 The American Physical Society, Physical Review B, vol. 37, No. 2, pp. 916–921, Jan. 15, 1988.

Gail et al., "Room–Temperature Photoluminescence Of $Ge_mSi_nGe_m$ Structures," 1995 American Insitute of Physics, pp. 2978–2980, Appl. Phys Lett. 66(22), May 29, 1995.

Fukatsu et al., "High–Temperature Operation Of Strained $Si_{0.65}Ge_{0.35}$/Si(111)p–type Multiple–Quantum–Well Light–Emitting Diode Grown By Solid Source Si Molecular–Beam Epitaxy," 1993 American Insitute of Physics, pp. 967–969, Appl. Phys. Lett. 63(7), Aug. 16, 1993.

Houghton et al., "Type I Band Alignment In $Si_{1-}Ge_x$/Si(001) Quantum Wells: Photoluminescence Under Applied [110] and [100] Uniaxial Stress," The American Physical Society, pp. 866–869, Physical Review Letters, vol. 75, No. 5, Jul. 31, 1995.

Brunner et al., "Near–Band–Edge Photoluminescence From Pseudormorphic $Si_{1-y}C_y$/Si Quantum Well Structures," 1996 The American Physical Society, pp. 303–306, Physical Review Letters, vol. 76, No. 2, Jan. 8, 1996.

Bernhard–Höfer et al., "Strained $Si_{1-x}Ge_x$ Multi–Quantum Well Waveguide Structures On (110) Si," 1995 American Institute of Physics, pp. 2226–2228, Appl. Phys. Lett. 66(17), Apr. 24, 1995.

LB

VB

Si    Si$_{1-x}$Ge$_x$ (a)

Si    Si$_{1-y}$C$_y$ (b)

Si    Si$_{1-x-y}$Ge$_x$C$_y$ (c)

FIG 1

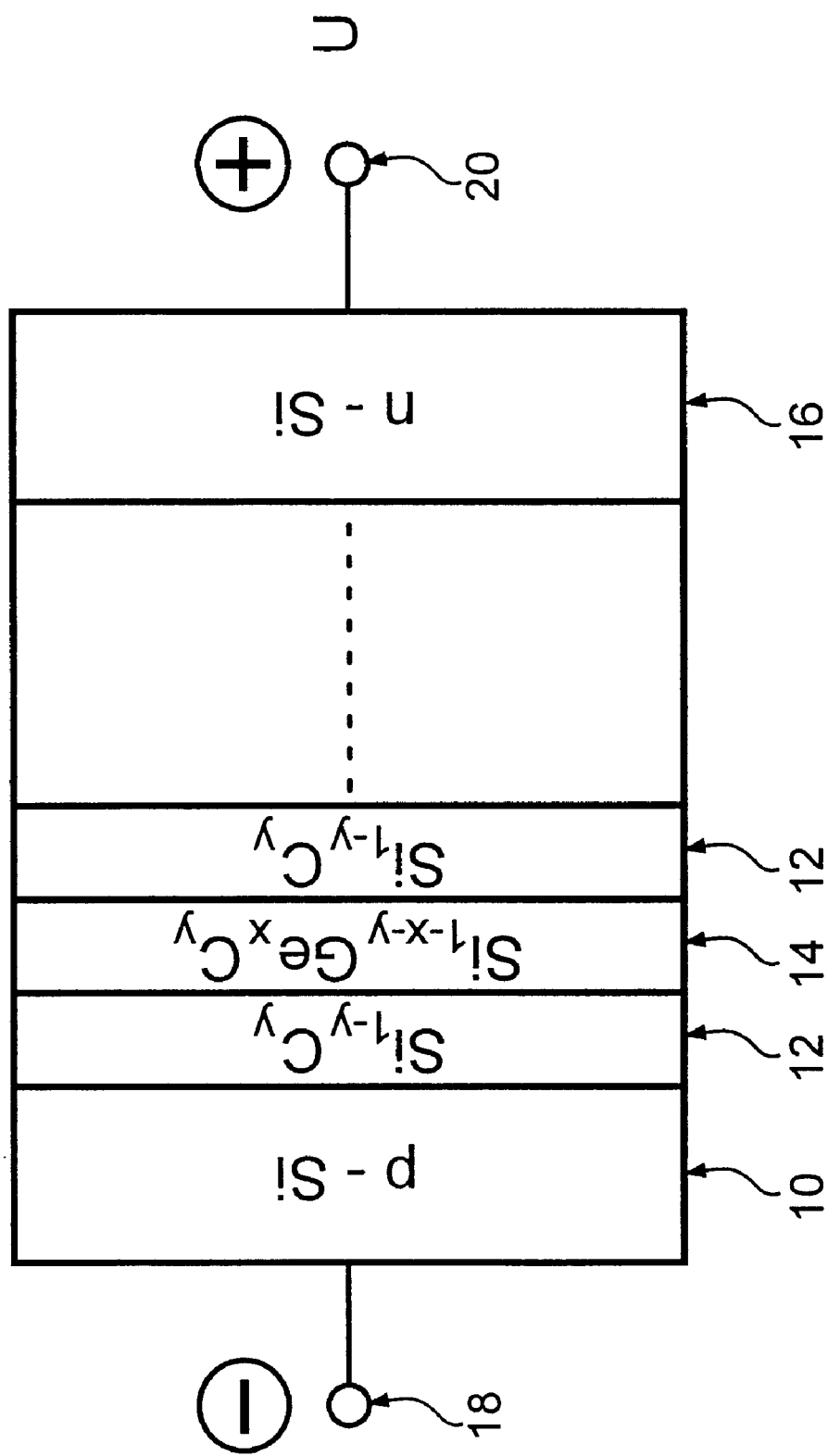
FIG 2a (LAYER SEQUENCE)

(BAND STRUCTURE)

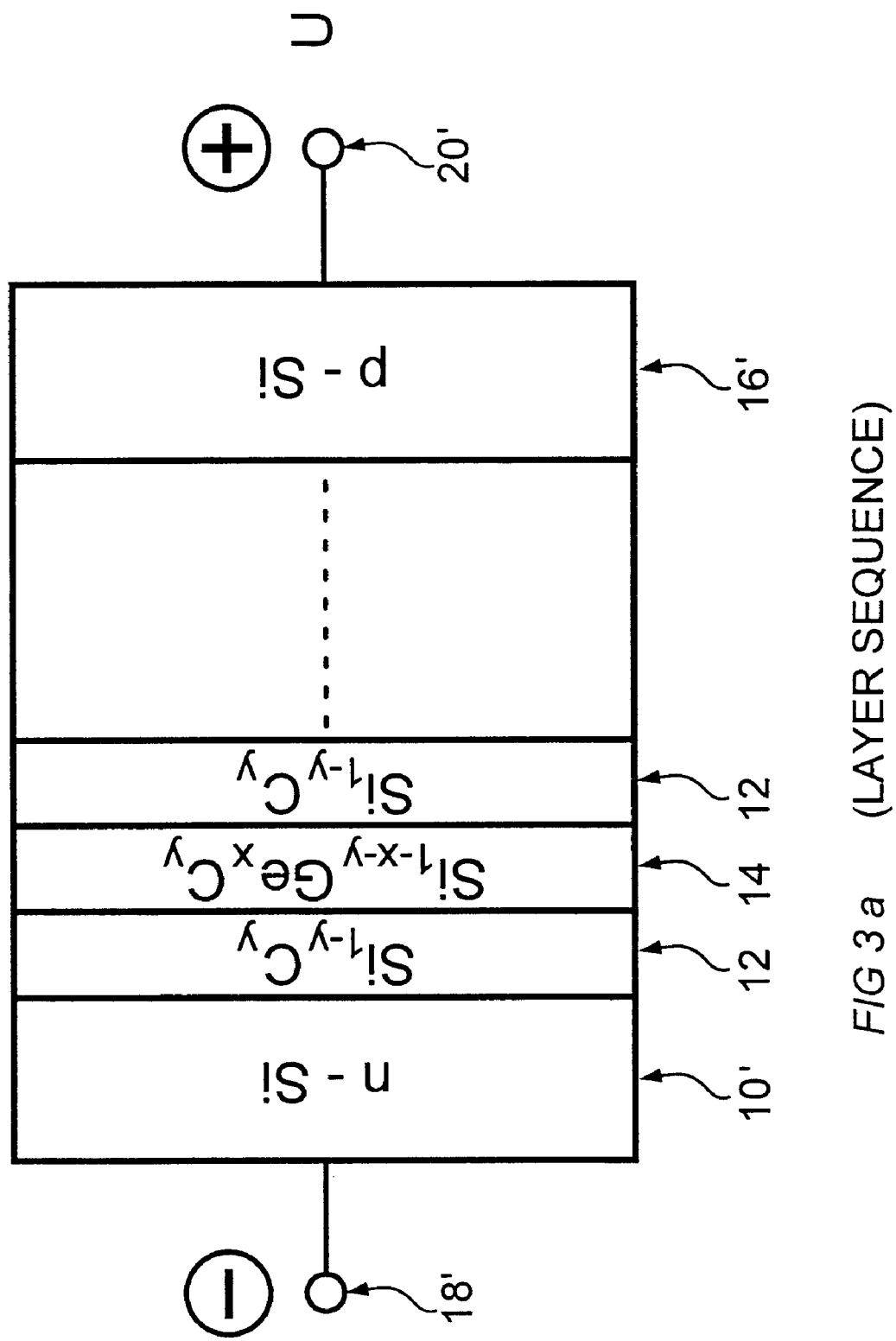
FIG 3a (LAYER SEQUENCE)

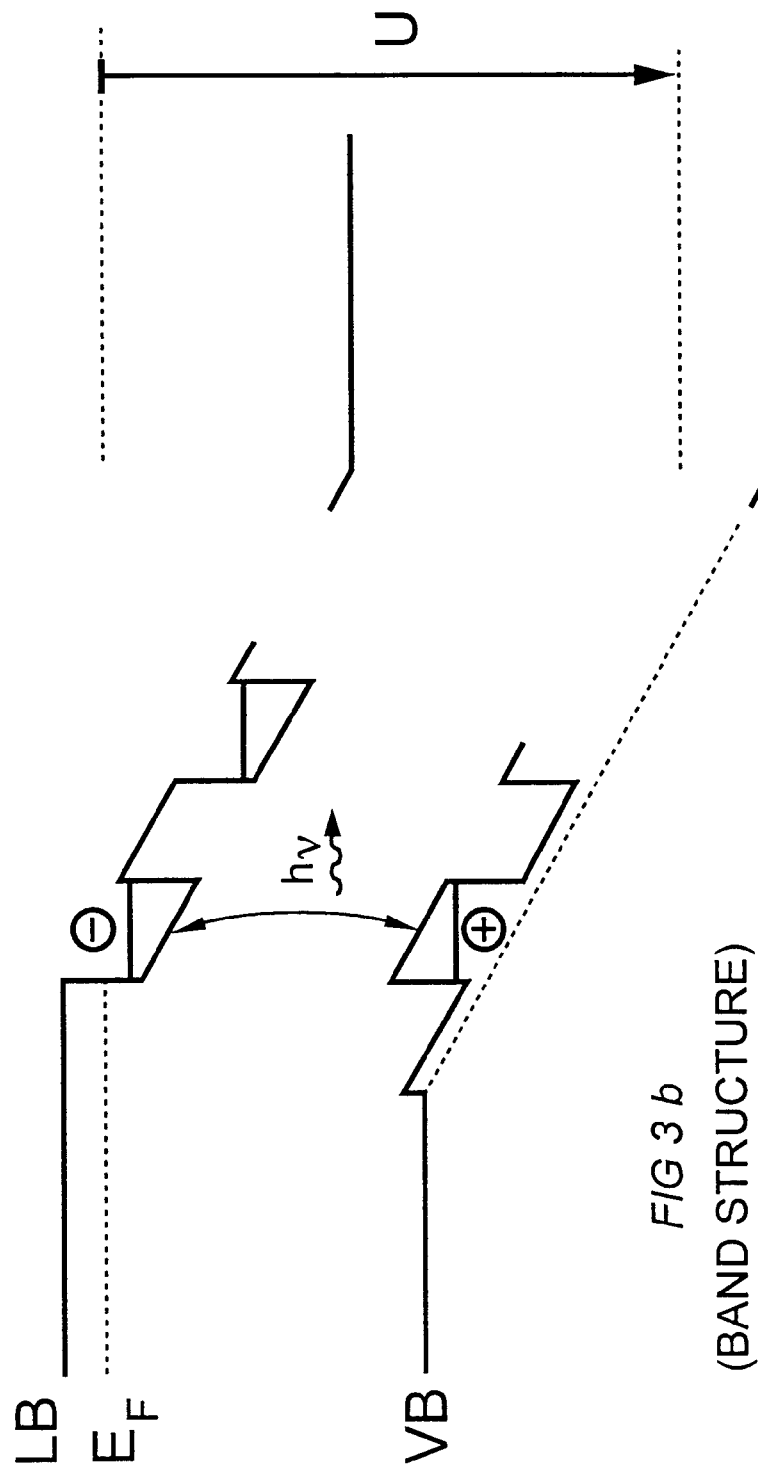
FIG 3 b (BAND STRUCTURE)

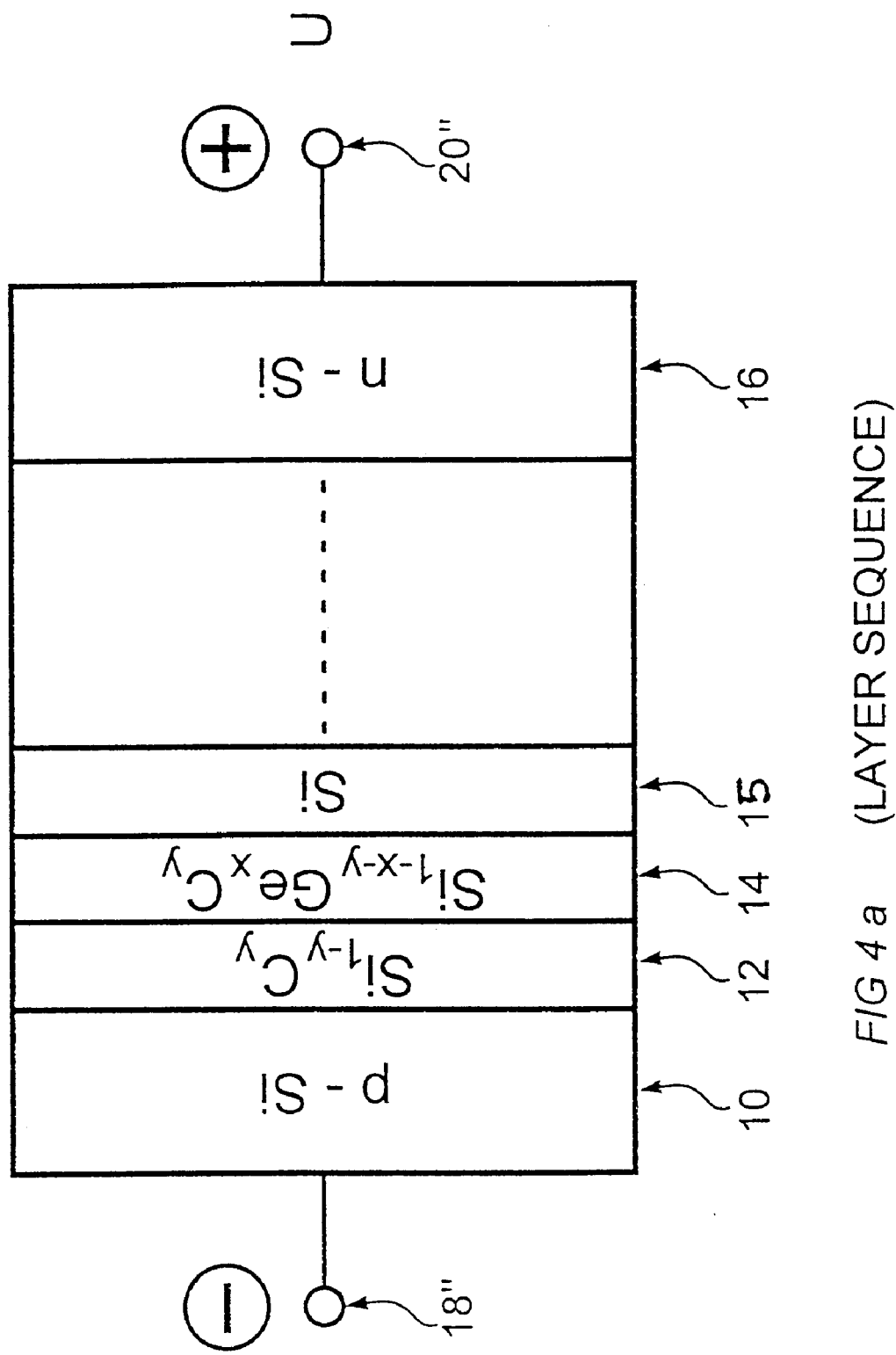
FIG 4a (LAYER SEQUENCE)

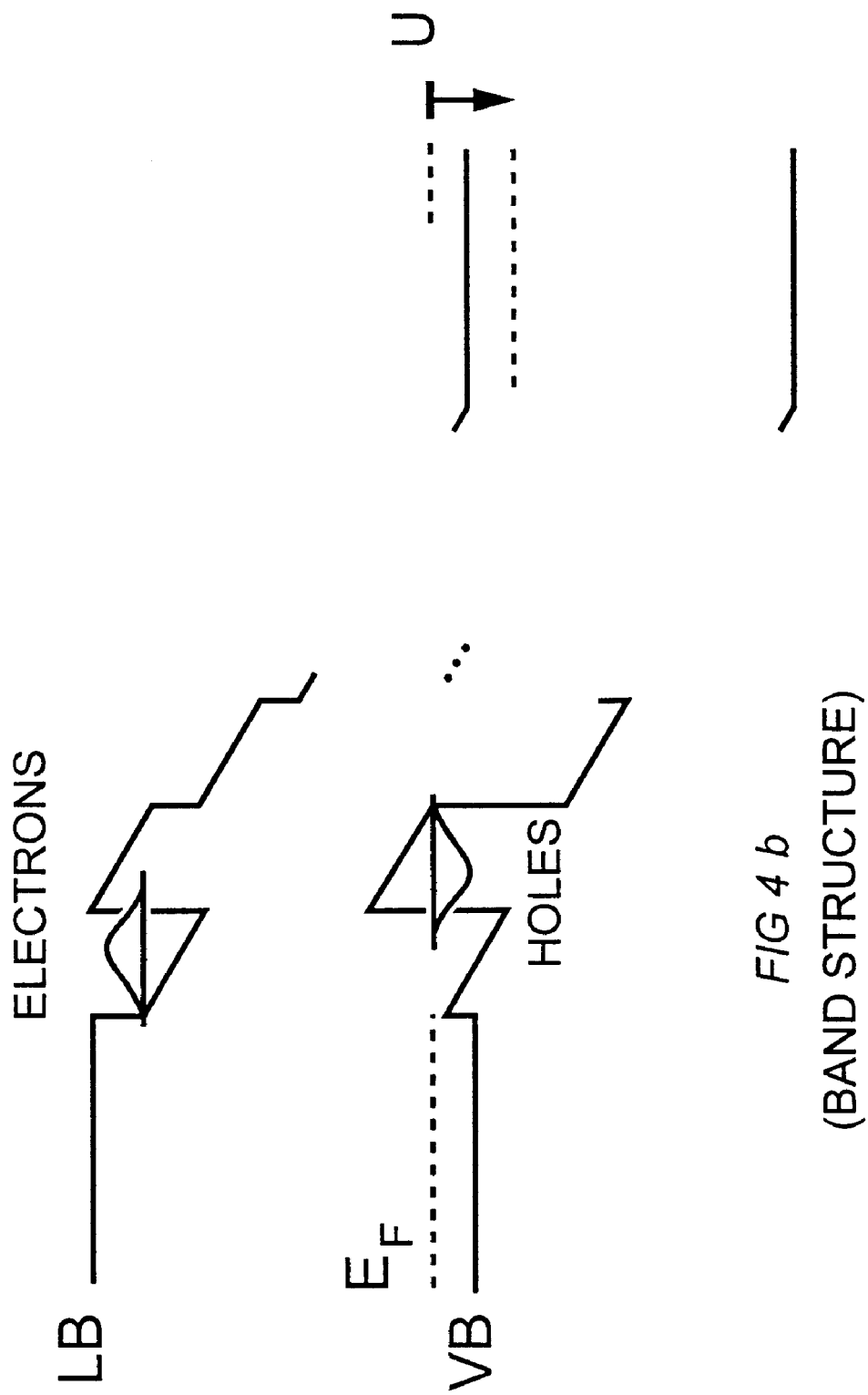
FIG 4b (BAND STRUCTURE)

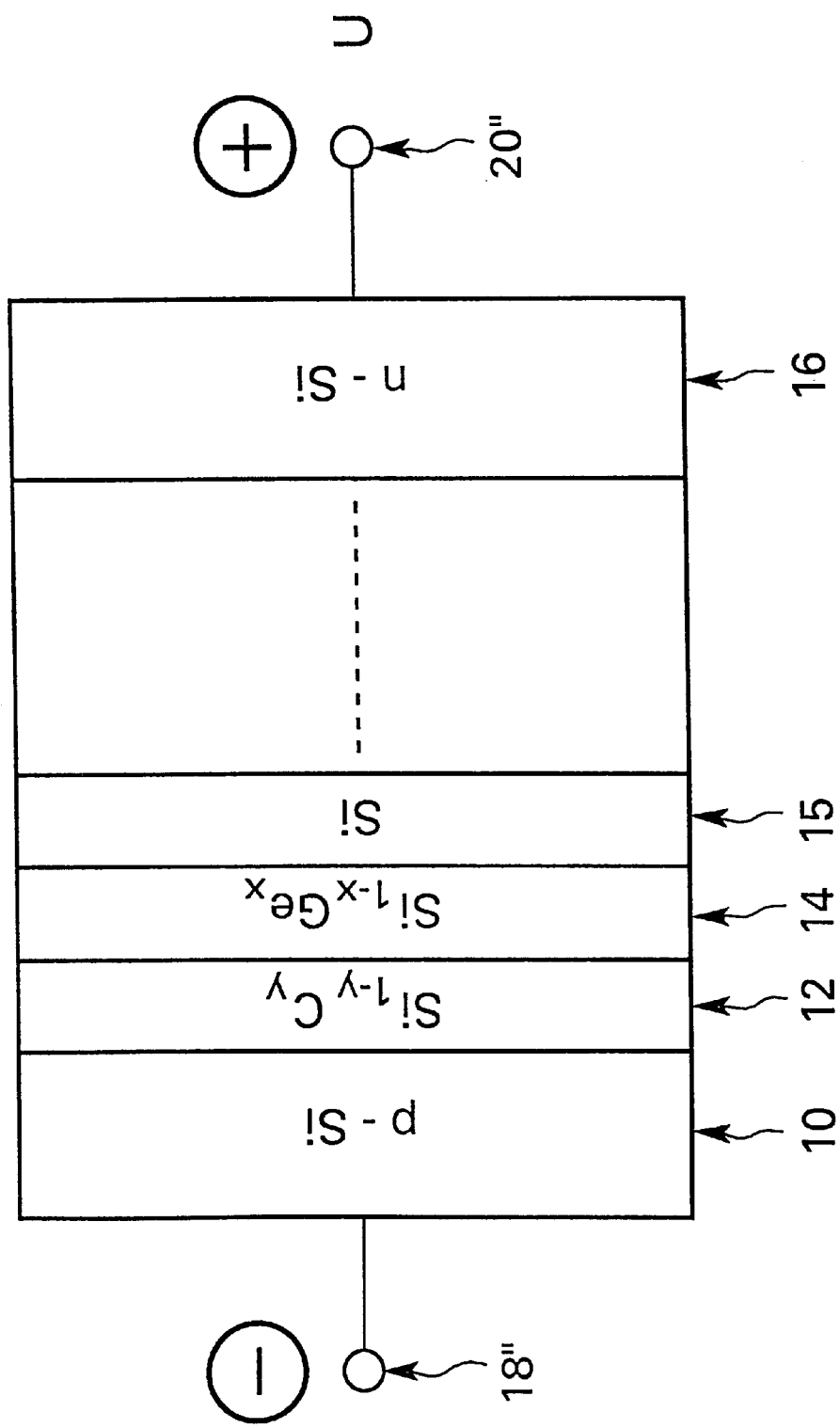
FIG.4c (LAYER SEQUENCE)

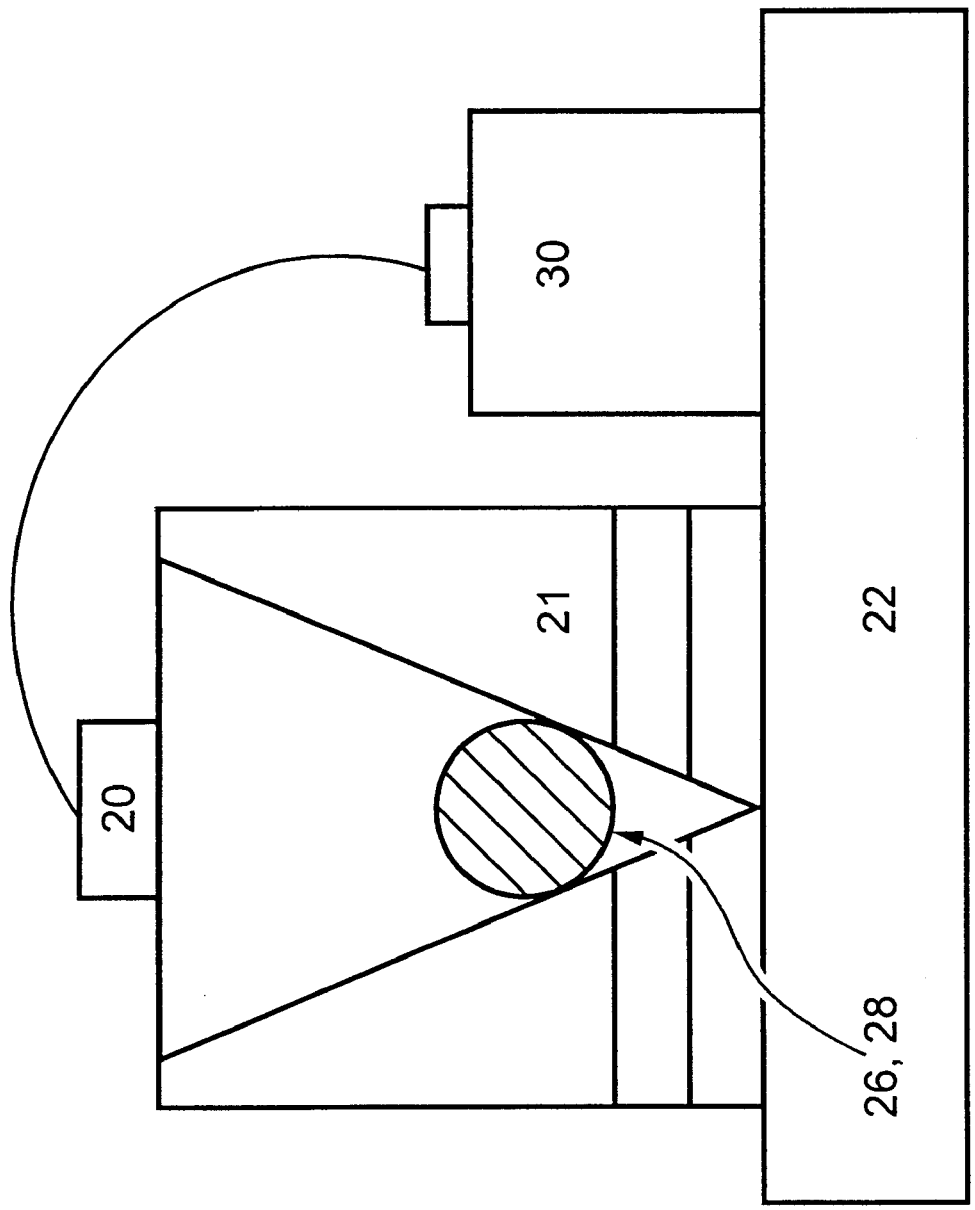

SEMICONDUCTOR COMPONENTS, IN PARTICULAR PHOTODETECTORS, LIGHT EMITTING DIODES, OPTICAL MODULATORS AND WAVEGUIDES WITH MULTILAYER STRUCTURES GROWN ON SILICON SUBSTRATES

FIELD OF THE INVENTION

Photodetectors and light emitting diodes (LEDs) in the wavelength range from 1.55 to 1.3 µm are used in telecommunication by means of glass fibers. At present, use is principally made of components based on III-V semiconductors which are relatively expensive.

DESCRIPTION OF PRIOR ART

Some proposals have been made relating to $Si_{1-x}Ge_x$/Si semiconductor components for use in this wavelength range and have been reported by H. Presting et al. in Semiconductor Science Technology 7, pages 1127 and sequel of 1992 and in App. Phys. Lett., Vol. 66 No. 17, Apr. 24, 1995 in the article "Strained $Si_{1-x}Ge_x$ multi-quantum well waveguide structure on (110) Si" by K. Bernhard Höfer, A. Zrenner, J. Brunner and G. Abstreiter.

However, substantial problems exist with such $Si_{1-x}Ge_x$/Si structures because Ge has a lattice constant which differs substantially from that of Si. The mechanical strain which thereby results in structures of this kind makes it necessary to restrict the thickness of the layers to an extent which places severe constraints on the use of the $Si_{1-x}Ge_x$/Si material system.

Proposals have also been made relating to light emitting diodes, realized by a p-n junction formed in silicon carbide. That is to say, the junction is formed by the transition from a p-SiC substrate to an n-SiC layer, with the contacts being provided at the two layers. One proposal of this kind is to be found in DE-A-23 45 198. A further discussion of this system is also to be found in DE-A 39 43 232 which states that SiC based LEDs are disadvantageous in comparison with various LEDs based on III-V or II-VI material systems. The reason given is that SiC has the disadvantage that the light yield for a p-n LED is low because SiC is a material with an indirect band gap. The document concludes that SiC LEDs cannot therefore be used for practical applications.

Finally, for the sake of completeness, reference should be made to DE-A-35 36 544 which discusses the deposition of a layer of semiconductor material from the gas phase onto the and of a glass fiber to form a detector. This is intended as a particularly simple way of coupling out the light from the glass fiber while simultaneously converting it into an electrical signal. It is stated that amorphous (hydrogen-containing) Si and amorphous compounds of Si with Ge, carbon or tin, amorphous Si carbide or Si nitride can be used as a semiconductor. This reference is not considered relevant to the present teaching, which is concerned with single crystal material.

OBJECT OF THE INVENTION

The present invention is based on the object of providing semiconductor components in the form of photodetectors, light emitting diodes, optical modulators and waveguides which can be grown on a silicon substrate at favorable cost, which permit adjustment of the effective band gap, which enable a pronounced localization of electrons and holes, which do not require the use of complicated relaxed buffer layers, which bring about enhanced optical absorption and emission and allow these parameters to be influenced and which, in certain structures, permit the optical absorption and emission to be changed (modulated) in energy and amplitude by the application of a voltage.

BRIEF DESCRIPTION OF THE INVENTION

In order to satisfy this object, there is provided a semiconductor component, such as a photodetector, a light emitting diode, an optical modulator or a waveguide formed on an Si substrate, characterized in that the active region consists of a layer structure with $Si_{1-y}C_y$, $Si_{1-x}Ge_x$, and/or $Si_{1-x-y}Ge_xC_y$ alloy layers or a multi-layer structure built up of such layers.

More specifically, the present invention relates to a semiconductor component having any one of the following structures:

a) a single layer of $Si_{1-y}C_y$ b) a superlattice comprising alternating layers of Si and $Si_{1-y}C_y$ c) a superlattice comprising alternating layers of $Si_{1-y}C_y$ and $Si_{1-x}Ge_x$ d) a superlattice comprising alternating layers of $Si_{1-y}C_y$ and $Si_{1-x-y}Ge_xC_y$, with the atomic fraction y of the $Si_{1-x-y}Ge_xC_y$ layers being equal to or different from the atomic fraction y of the $Si_{1-y}C_y$ layers e) a superlattice comprising a plurality of periods of a three-layer structure comprising Si, $Si_{1-y}C_y$ and $Si_{1-x}Ge_x$ layers f) a single layer of $Si_{1-x-y}Ge_xC_y$ g) a superlattice comprising alternating layers of Si and $Si_{1-x-y}Ge_xC_y$ and h) a superlattice comprising a plurality of periods of a three-layer structure comprising Si, $Si_{1-y}C_y$ and $Si_{1-x-y}Ge_xC_y$ layers, with the atomic fraction of y of the $Si_{1-x-y}Ge_xC_y$ layers being equal to or different from the atomic fraction y of the $Si_{1-y}C_y$ layers.

An important recognition underlying the present invention is namely that Si-based multilayer or superlattice structures with $Si_{1-y}C_y$/$Si_{1-x}Ge_x$/and/or $Si_{1-x-y}Ge_xC_y$ alloy layers open up the possibility of tailoring the lattice constants, the band gap and the shape of the band edges for the various semiconductor components.

In particular it has been found that it is possible to grow both $Si_{1-x}Ga_x$/$Si_{1-y}C_y$ and $Si_{1-x-y}Ge_xC_y$/$Si_{1-y}C_y$ multilayer structures which are nearly compensated in average strain, and which do not suffer from deterioration of their properties due to strain relaxation. It has been found that with multi-layer structures with at least double quantum wells, surprising properties are obtained which are considerably enhanced in comparison to the properties obtained with single quantum wells. Thus, for example, an improved photoluminescent efficiency has been found for $Si_{1-x-y}Ge_xC_y$/$Si_{1-y}C_y$ double quantum wells embedded in Si when compared to single quantum wells. This enhancement is considered to be quite remarkable considering the small overlap of the charge carrier wave functions. Considerably higher photoluminescent transition rates are achieved with short period $Si_{1-x-y}Ge_xC_y$/$Si_{1-y}C_y$ superlattice structures. Further enhanced photoluminescent transitions and an efficient capture of excited carriers even at room temperature can be expected for larger Ge and C contents, which appear to be practicable.

From experiments conducted to data it appears that photoluminescence can be achieved at the wavelengths of particular interest for optical fiber transmissions, i.e. in the range from 1.55 to 1.3 µm (corresponding to 0.7 to 0.85 eV)

and that the efficiencies which can be achieved will competitive with those of existing LEDs based on III-V or II/Vi material systems. Moreover, since the photoluminescent devices proposed here are based on Si, they should be readily acceptable and less expensive to produce, making use of known Si processing technology.

Hitherto the carbon required for the semiconductor components proposed here has been obtained from a graphite filament. It is believed that higher carbon concentrations will be achievable and the process will be better controllable in future. Carbon may also be deposited from the gas phase using suitable carbon-containing gases, such as methane or propane in a chemical vapor deposition system (CVD).

The atomic fractions x of Ge and y of C in the $Si_{1-x-y}Ge_xC_y$ layers and of y in $Si_{1-y}C_y$ layers may be chosen in accordance with the guidelines given in claims 3 to 6. The values given there enable the realization of semiconductor components with beneficial properties in the sense of satisfying the objects outlined above.

The $Si_{1-x-y}Ge_xC_y$, $Si_{1-y}C_y$ and $Si_{1-x}Ge_x$ layers are all substantially undoped, i.e. if dopants are present, they are due to impurities which cannot be avoided in practice. They are not, however, usually intentionally added to modify the properties of the devices under discussion.

The useful thicknesses of the alloy layers proposed in the present application in multi-layer and superlattice structures has generally been found to lie in the range from about 0.5 nm to about 10 nm.

When realizing the semiconductor components using superlattice structures, which have particularly beneficial properties, then the superlattice structure should preferably have a minimum of 10 periods and should generally not exceed more than 100 periods because of the additional cost of manufacturing such components. Favorable properties are obtained with 2 or more periods of the superlattice structures, and generally 25 to 50 periods is considered sufficient.

All the semiconductor components to which the present invention is directed, i.e. optical detectors, light emitting diodes, optical modulators and optical waveguides, can be realized using the same basic layer system.

Preferred variants for the optical detector are set forth in claims 14 and 15 and preferred variants for a light emitting diode having essentially the same structure but with reversed bias polarity are set forth in claims 16 and 17. Preferred optical modulators are achieved using basically the same layout as for an optical detector but with intrinsic layers of Si between each period of the superlattice.

For modulation to occur, the modulating voltage is, for example, applied to the positive pole, which enables the level of absorption of photons within the structure to be varied in proportion to the applied voltage.

The same basic structure as is used for all three devices can also be used as an optical waveguide and it is fortuitous that the refractive indices of the individual layers are such that light propagation parallel to the layers is possible with low losses. The ability to realize all four structures using the same or similar layer systems means that it is eminently possible to realize any desired combinations of the four structures on one chip. Thus a photodiode, an optical modulator and an optical detector could all be placed on one chip, with optical waveguides serving to transfer the light from the photodiode to the optical modulator and from the optical modulator to the optical detector. In addition, existing Si technology can readily be used to realize an infinite variety of different circuits on the same chip so that the optical devices of the present invention can be combined with all kinds of signal processing and generating circuits.

Furthermore, the structures proposed herein can readily be adapted to cooperate directly with optical fibers. Thus, as set forth, for example, in claim 23, a preferably V-shaped blind channel can be formed in the semiconductor component, with the blind channel having an end face transverse to an elongate direction of the channel and formed by a side face of an active region of the component itself, with the channel being adapted to receive one or more optical fiber ends for coupling an optical fiber or fibers to the relevant component or device.

Preferred embodiments of the invention are set forth in the claims and in the following description.

BRIEF LISTING OF THE FIGURES

The invention will now be described in more detail by way of example only and with reference to specific embodiments as shown in the drawings.

Figure 2C:
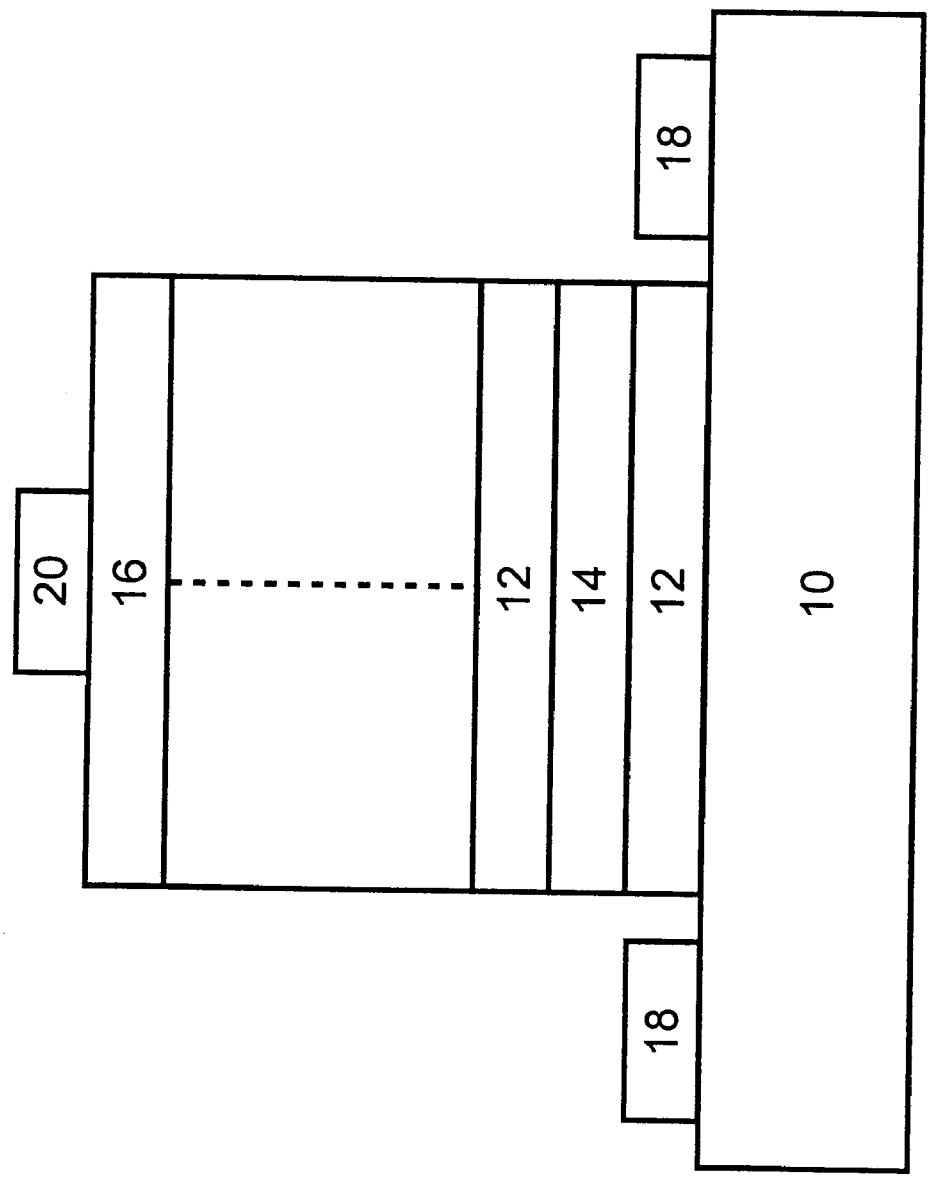

In the drawings there are shown:

FIGS. 1a, 1b and 1c the shape of the band edges for a) an $Si/Si_{1-x}Ge_x$ heterostructure, b) an $Si/Si_{1-y}C_y$ heterostructure, and c) an $Si/Si_{1-x-y}Ge_xC_y$ heterostructure, FIGS. 2a, 2b and 2c the layout in principle of a photodetector in the form of a PIN diode, with FIG. 2a showing the typical layer sequence. FIG. 2b showing the band structure, and FIG. 2c showing the preferred manner of realizing the contacts to the structure, FIGS. 3a and 3b the layout in principle of a light emitting diode, again with FIG. 3a showing the typical layer sequence and FIG. 3b showing the band structure, FIGS. 4a to 4c the layout in principle of an optical modulator, with FIG. 4a showing the typical layer sequence, FIG. 4b showing the band structure and FIG. 4c showing an alternative layer sequence in the form of a superlattice comprising a plurality of periods of a three-layer structure comprising Si, $Si_{1-y}C_y$ and $Si_{1-x-y}Ge_xC_y$ layers, FIG. 5 the layout in principle of a waveguide with reference to the multilayer structure, FIGS. 6a and 6b a schematic illustration of a chip having a photodetector in accordance with FIG. 2a disposed at the end of a channel in which the end of an optical fiber is secured, with FIG. 6b being a view on the plane 6b–6b of FIG. 6a, FIG. 7 a schematic plan view of two chips interconnected by an optical fiber, FIG. 8 a plot of photoluminescent intensity versus energy for various quantum well structures, FIG. 9 a graphical representation relating no-phonon luminescent energy to carbon content for various quantum well structures, FIG. 10 a plot of photoluminescent intensity versus energy for a series of double quantum well samples with various layer widths, and FIG. 11 a graphical representation relating no-phonon pl energy and intensity to layer width.

DESCRIPTION OF PREFERRED EMBODIMENTS

Turning first of all to FIG. 1a, the shape of the valence band VB and conduction band LB edges is shown for the transition from an Si single crystal substrate to a $Si_{1-x}Ge_x$ alloy. It can be seen that the $Si_{1-x}Ge_x$ alloy layers have a smaller band gap than Si and that the band edge step is mainly in the valence band.

FIG. 1b shows again the valence band VB and the conduction band LB for the transition from an Si single crystal substrate to an $Si_{1-y}C_y$ alloy. It can be seen from this diagram that $Si_{1-y}C_y$ alloy layers have a smaller band gap than Si and it is noted that the band edge step in $Si/Si_{1-y}C_y$ heterostructures is mainly in the conduction band.

FIG. 1c shows the valence band VB and the conduction band LB for the transition from an Si single crystal substrate to a $Si_{1-x-y}Ge_xC_y$ alloy. Again the $Si_{1-x-y}Ge_xC_y$ alloy layers have a smaller band gap than Si. There is again a pronounced step in the valence band. However, the valence band edge step in Si/SiGeC heterostructures does not change significantly with increasing C content. The energy of the conduction band edge does, however, increase with increasing carbon content, i.e. with an increasing atomic fraction y of carbon.

FIG. 1 does not show the band diagrams for the transition from $Si_{1-y}C_y$ alloy layer to a $Si_{1-x}Ge_x$ layer or for the transition from a $Si_{1-y}C_y$ layer to a $Si_{1-x-y}Ge_xC_y$ layer. However, the band diagrams for these transitions can be put together from the diagrams of FIGS. 1a to 1c by aligning the respective elements of the diagrams with reference to the Fermi level $E_f$.

By forming sequences of $Si_{1-y}C_y$ and $Si_{1-x}Ge_x$ layers, or sequences of $Si_{1-y}C_y/Si_{1-x-y}Ge_xC_y$ layers, electrons and holes (in neighboring layers) can be strongly localized. This is not possible directly on an Si substrate because of the small conduction band edge step in Si/SiGe heterostructures as shown in FIG. 1a. By incorporation of carbon alloys, the absorption and the luminous yield can thus be substantially increased and the effective band gap can be set in a clearly broadened energy range. The localization of the electrons in the $Si_{1-y}C_y$ layers and the holes in the $Si_{1-x}Ge_x$ or $Si_{1-x-y}Ge_xC_y$ layers can be adjusted by optimizing the corresponding layer thicknesses and x and y concentrations.

On Si substrates the $Si_{1-y}C_y$ layers are laterally expanded whereas the $Si_{1-x}Ge_x$ layers are laterally compressed. The mechanical strain $\epsilon$ relative to Si can be expressed by the quotation $$\epsilon = 0.35y - 0.04x,$$

which reflects the different lattice constant of Ge and C relative to Si.

Thus for $Si_{1-x}Ge_x$ $$\epsilon = 0.35x - 0.04x = -0.04x,$$

the negative sign signifies the compression of the $Si_{1-x}Ge_x$ layer relative to Si.

For $Si_{1-y}C_y$ $$\epsilon = 0.35y - 0.4x0 = 0.35y$$

and shows that $Si_{1-y}C_y$ layers are expanded relative to Si. For $Si_{1-x-y}Ge_xC_y$ layers it is possible by selection of appropriate values for x and y to ensure that $\epsilon$ relative to Si is very small. Such structures, i.e. structures where the mechanical strain $\epsilon$ of $Si_{1-x-y}Ge_xC_y$ layers is kept small relative to Si by appropriate choice of x and y for the $Si_{1-x-y}Ge_xC_y$ layers are herein termed compensated structures. Because the mechanical strain of such structures is kept low, there is no pronounced tendency for strain relaxation to occur, even with relatively thick layers so that substantial freedom exists for selecting the desired layer thicknesses without having to fear defects due to strain relaxation and without having to use complicated buffer layers to avoid strain relaxation. Thus, the disadvantageous effects of such buffer layers on the desired properties of the devices are also avoided.

The present invention also relates to a layer structures based on $Si_{1-y}C_y/Si_{1-x}Ge_x$ layers. Here a different mechanism is used to avoid the disadvantageous effects of mechanical strain. It will namely be apparent from the discussion given immediately above that layers of $Si_{1-y}C_y$ are laterally expanded relative to Si and layers of $Si_{1-x}Ge_x$ are laterally compressed relative to Si. If now alternate layers of $Si_{1-y}C_y$ and $Si_{1-x}Ge_x$ are grown on an Si substrate, with or without intermediate Si layers, then—provided the layer thicknesses are kept relatively thin—structures can be grown which have no average strain and no strain relaxation. It has been found that such structures—herein termed "symmetrificated structures"—can be realized with layer thicknesses and band gaps which ensure very interesting and unexpected properties enabling the realization of improved components of the above described kind of Si.

Thus a low distortion can be realised in $Si_{1-x-y}Ge_xC_y$ layers and a symmetrically distorted and thus stable layer sequence can be realized in multilayer structures on Si.

The combination of thin SiGe, $Si_{1-y}C_y$ and SiGeC alloy layers on Si substrates opens up the possibility of forming the named components directly on Si substrates and thus of manufacturing them cost effectively. The integration and combination of the proposed components on one Si substrate is also possible.

The advantages of these novel material combinations for the proposed components are:

They are based on Si substrates and thus have a considerable cost advantage over III-V semiconductors.

Adjustment of the effective band cap by quantum well structures consisting of $Si_{1-y}C_y/Si_{1-x}Ge_x$ or $Si_{1-y}C_y/Si_{1-x-y}Ge_xC_y$ layer sequences.

Strong localization of electrons and holes directly on Si substrate is possible. For Si/SiGe heterostructures without C this is only possible through the use of complicated relaxed SiGe buffer layers.

These layer sequences bring about an increase of the optical absorption and emission as a result of quantum mechanical effects (e.g. confinement, mixing of $\Gamma$ and $\Delta$ electron states and superlattice effects).

the size of the optical absorption and emission are strongly influenced by the overlap of electron and hole states. These and the energy/wavelength can be set via the Ge and C content, by the layer thicknesses and by the spacing of the layers.

In asymmetrical layer sequences the optical absorption and emission can be changed in amount and energy by the application of a voltage.

FIG. 2 shows the layout in principle of a photodiode with $Si_{1-y}C_y/Si_{1-x-y}Ge_xC_y$ layer sequences in the intrinsic region of the diodes.

The PIN diode of FIG. 2a is formed on a p-Si substrate 10, which is typically 0.5 mm thick. The p-doping is, for example, achieved by use of boron as a p-dopant at a concentration of $10^{18}$ cm$^{-3}$. On top of this substrate there is then grown an alternating layer sequence comprising a plurality of periods, for example, twenty-five periods of a multilayer structure comprising alternating undoped layers 12 of $Si_{1-y}C_y$ and 14 of $Si_{1-x-y}Ge_xC_y$. Such a multilayer structure is frequently referred to as a superlattice structure. Important for the invention is that at least one period of the $Si_{1-y}C_y/Si_{1-x-y}Ge_xC_y$ structure is present.

Figure 11:
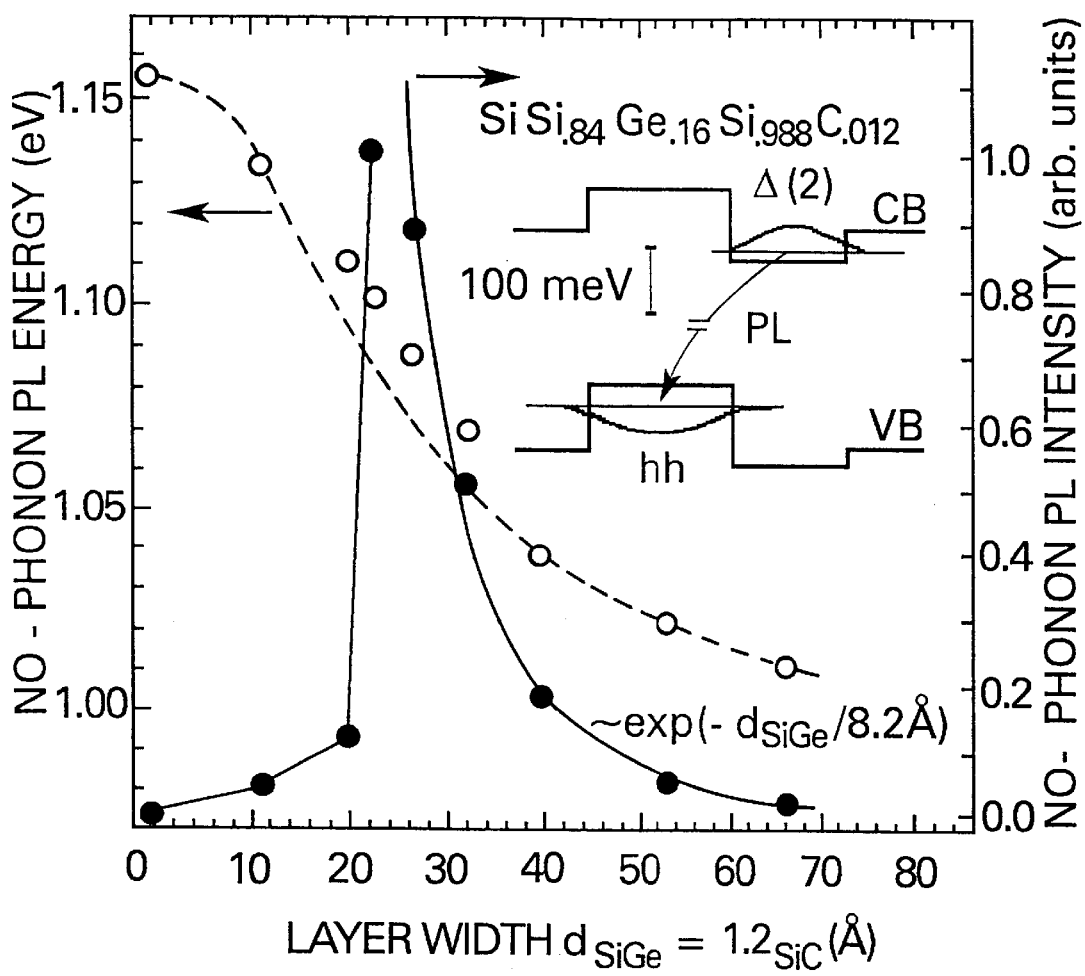

The layer thicknesses selected for each of the layers 12 and 14 is typically in the range from 0.5 nm to 10 nm. The effect of the layer thickness on the properties of the structure are shown by FIG. 11, which will be discussed later in more detail.

For the structure shown in FIG. 2 the atomic fraction x and y in the $Si_{1-x-y}Ge_xC_y$ layers should preferably be selected with x in the range from 0.3 to 1.0 (i.e. GeC) and with y in the range from 0.02 to 0.12. For the $Si_{1-y}C_y$ layer y can again be selected in the range from 0.02 to 0.12, and can be different from the value of y chosen for the $Si_{1-x-y}Ge_xC_y$ layers.

In practice the multilayer structure is not directly onto the p-Si substrate but rather further p-Si material is generally deposited on the substrate in the vacuum chamber to ensure a good crystal structure for a subsequent growth of the multilayer structure. Once the desired number of periods of the multilayer structure have been deposited, a layer 16 of n-type Si with a thickness of approximately 100 nm is deposited as a covering layer. The n-type conductivity is achieved by doping with phosphorous or antimony and a doping density of the order of magnitude of $10^{18}$ cm$^{-3}$ is preferred. A first contact 18 is provided to the p-Si layer 10 and a second contact 20 is provided to the n-Si layer 16.

Although it is possible to realize the first contact 18 as a back contact, the structure of FIG. 2a would normally be realized in practice by first of all building up the layer structure and then etching it in the manner shown in FIG. 2c so that a pillar-like structure remains on the p-Si substrate 10. The contact 18 is then provided, e.g. in the form of a ring contact surrounding the pillar 22 left after etching. FIG. 2c also shows that the contact 20 to the upper n-Si layer 16 is located, for example, generally in the middle of the layer 16, which permits the incident light to pass through the layer 16 around the contact 20 to reach the active region formed by the layers 12, 14. The structure of FIG. 2a is shown turned sideways so that the correlation to the band diagram of FIG. 2b can be more readily seen.

It will be noted that although the material system has an indirect band gap, there is a substantial overlap of the wave functions in the conduction and valence bands so that an incoming photon hv has a relatively high probability of stimulating the transfer of an election from the valence band into a potential well in the conduction band on the other side of the interface and this is detected as an output current, provided an applied bias voltage is present.

Although the photodetector described here has the form of a PIN diode with the intrinsic active region formed by the superlattice with the layers 12, 14, the device could also be realized as an NIP structure, i.e. grown on an n-Si substrate. If this is done, then the positive contact is made to the substrate and the negative contact to the p-Si capping layer.

Although the photodetector structure has been described with respect to the variant d) of claim 2, it will be understood that it could also be produced using the layer structures of any of the variants a) to h) described above.

If the photodetector is realized using the layer structure of variant c) of claim 2, i.e. $Si_{1-y}C_y/Si_{1-x}Ge_x$ layers, then x is preferably selected to lie in the range from 0.3 to 1.0 and y is preferably selected to lie in the range from 0.02 to 0.012.

The advantages of this structure are an additional lowering of the conduction band through $Si_{1-y}C_y$ layers, increased absorption in the $Si_{1-y}C_y/Si_{1-x-y}Ge_xC_y$ multilayer structure in the active region, and a greater size of the active region which can be realized by symmetrification or compensation of the distortion.

It will be understood that the term photodetector or optical detector includes the variants avalanche diode, PIP, PIN, NIP, NIN diodes, combined diodes, individual components and arrays thereof.

FIG. 3a shows the layout in principle of a light emitting diode which closely resembles the photodetector of FIG. 2a. The difference here lies principally in the fact that the multilayer structure 12, 14 is grown on an n-Si substrate 10' rather than a p-Si substrate, and in the fact that the covering layer 16' is realized as a p-type Si layer.

In addition, the polarity of these contacts is reversed, i.e. the contact 18' to the n-Si substrate is a negative contact and the contact 20' to the p-Si covering layer is a positive contact. However, it would also be possible to realize the light emitting diode of FIG. 3 on a p-Si substrate with an n-Si capping layer, provided the polarities of the contacts are reversed.

The layer thicknesses of the structure correspond to those of the photodetector of FIG. 2a. The n-Si substrate will also have a typical doping density of $10^{18}$ cm$^{-3}$ achieved by the use of phosphorous or antimony dopants, whereas the p-Si covering layer 16' will have p-type conductivity with a doping density of the order of magnitude of $10^{18}$ cm$^{-3}$, typically achieved by the use of boron as a dopant.

For the $Si_{1-x-y}Ge_xC_y$ layers x is preferably selected in the range from 0 to 0.5 and y in the range from 0 to 0.1. For the $Si_{1-x}C_y$ layers y is preferably chosen to lie in the range from 0.02 and 0.1. If the $Si_{1-y}C_y/Si_{1-x}Ge_x$ layer structure is used, then x is preferably selected in the range from 0.2 to 0.5 ad y is preferably selected to be about 0.04. Although the light emitting diode of FIG. 3a has been described with respect to the $Si_{1-y}C_y/Si_{1-x-y}Ge_xC_y$ layer structure, it could also be realized in using the layer structure of any of the aforementioned variants a) to h)).

In the practical form, the component of FIG. 3a will be formed by etching as shown in FIG. 2c for the photodetector. Again, it is important that the contact 20' to the covering layer 16' is of relatively small area in comparison to the area of the layer 16' to enable the light generated in the LED to escape through the covering layer. This is, however, not so critical if the device is formed on a chip with light emission sideways, i.e. parallel to the layer structure. The band diagram with the applied operating voltage is shown in FIG. 3b.

It will be noted that there is a pronounced overlap of the wave functions for electrons and holes in the conduction and valence bands, despite the indirect band gap, and this results in the high luminous efficiency of the component.

The advantages of this device are, in addition to the lowering of the conduction band in $Si_{1-y}C_y$ layers leading to emission in a preferred wavelength range, increased luminous yield in the $Si_{1-y}C_y/Si_{1-x-y}Ge_xC_y$ multilayer structure in the active region through greater confinement of electrons and holes, mixing of $\Gamma$ and $\Delta$ electron states and superlattice effects as well as a larger active region realizable by symmetrification or compensation of the distortion.

It will be understood that light emitting diodes include LEDs and laser diodes (waveguide structures, surface emitting lasers with Bragg reflectors etc.).

FIG. 4 shows an optical modulator and has a layer structure basically similar to the photodetector of FIG. 2 but with additional layers 15 of Si present between each successive pair of $Si_{1-y}C_y/Si_{1-x-y}Ge_xC_y$ layers 12, 14. By applying a varying potential across the terminals 18, 20, it is also possible to modulate the absorption of light passing through the optical modulator parallel to the layers. It is possible to design the structure with a graded index for the Ge and/or C content(s), which makes it possible to tailor the absorption properties by influencing the separation of the electrons and holes. When these are moved closer together, the absorption becomes higher.

Although the optical modulator of FIG. 4 has been realized on the basis of the layer structure of variant h) as described above, it could also be realized using the layer structures of variants c), d) or e).

The advantages are:

The localization of electrons in the $Si_{1-y}C_y$ layer and of holes in the neighboring $Si_{1-x-y}Ge_xC_y$ layer makes it possible to strongly modulate the absorption by the application of an electrical voltage.

The absorption with and without positive or negative voltage can be adjusted through the sequence of the layers or the asymmetry of the structure relative to the doped regions (the Fig. shows an example with spacing (U=0) <spacing (U>0)).

The energy range up to 1.55 μm is accessible as a result of the additional lowering of the conduction band in the $Si_{1-y}C_y$ layers.

Exploitation of the increased absorption in the $Si_{1-x-y}Ge_xC_y/Si_{1-y}C_y$ multi-layer structure in the active region with appropriate polarity of the electrical voltage.

Greater layer thickness and larger active region can be realized because of symmetrification or compensation of the distortion.

With coupling-in of the light in the layer plane the combination with waveguide function and thus a large active volume is possible.

Figure 5:
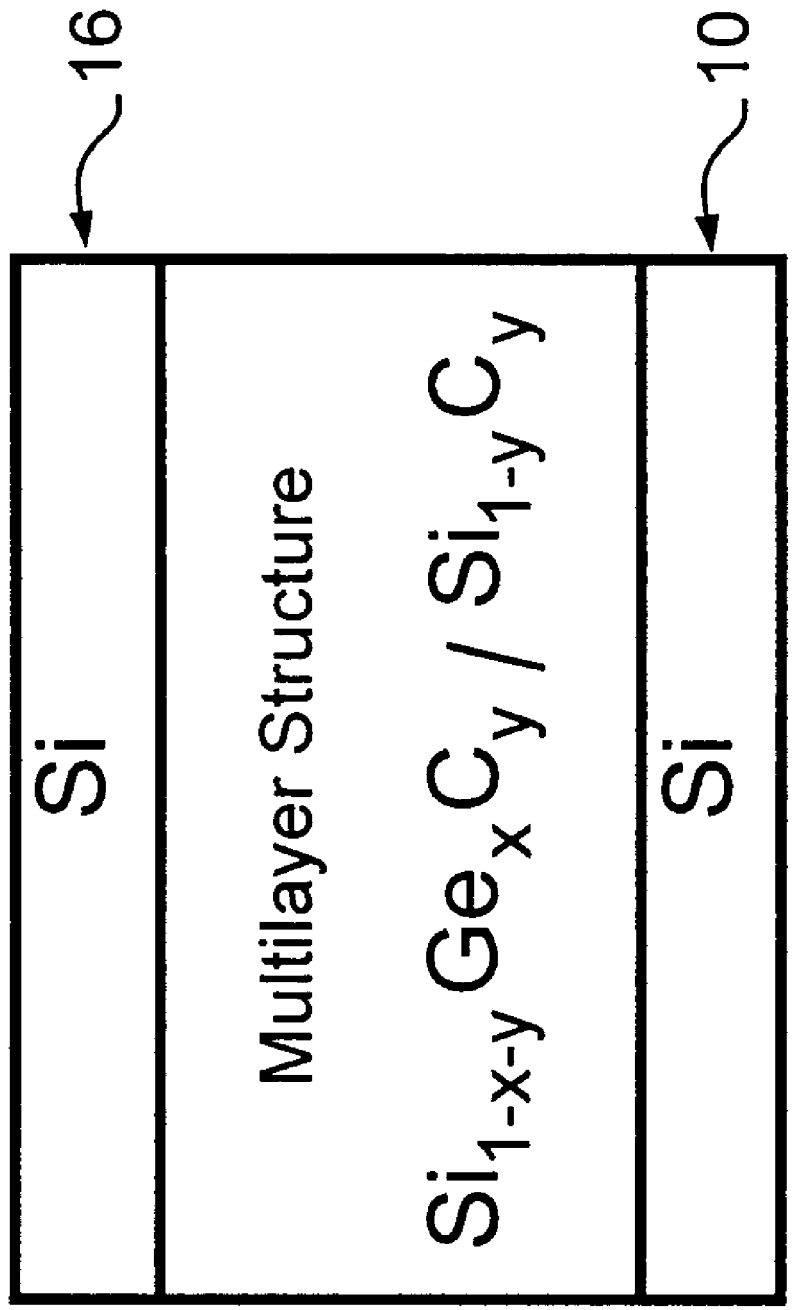
Figure 6A:
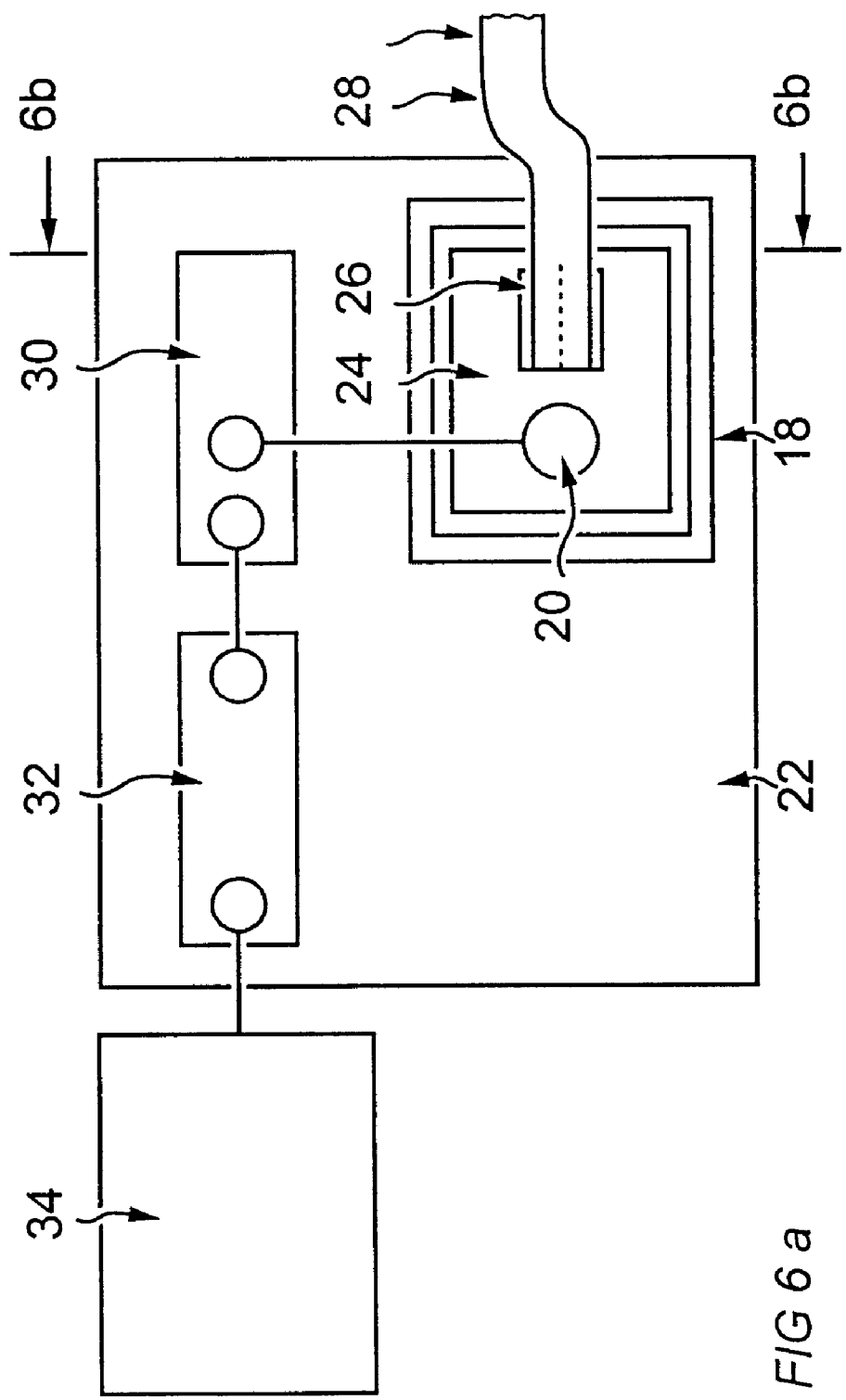

FIG. 5 shows the layout in principle of a waveguide having $Si_{1-x-y}Ge_xC_y/Si_{1-y}C_y$ multi-layer structures with n>n< (S) in Si.

FIG. 5 shows an optical waveguide comprising a multi-layer structure in accordance with variant d) sandwiched between an Si substrate 10 and an Si covering layer 16. There are no contacts to this structure. It simply has to efficiently conduct light parallel to the layers. To ensure efficient light conduction, the total layer thickness of the active region should not be substantially smaller than the wavelength of the light with which the optical waveguide is to be used. It is also not essential to use a multi-layer structure. Instead, a single layer of $Si_{1-y}C_y$ (variant a)) or a single layer of $Si_{1-x-y}Ge_xC_y$ (variant f)) could be used. The advantage is that the optical waveguide is formed of the same materials as are used for other components, which facilitates the realization of the waveguide on a chip together with such other components. In the case of a single layer of $Si_{1-x-y}Ge_xC_y$ x and y can be 0.08 and 0.01 respectively, i.e. the layer is $Si_{0.91}Ge_{0.08}C_{0.01}$. The optical waveguide can be realized using any of the layer structures of the variants a) to h).

The advantages are:

Refractive index step n>n (Si) realizable with $Si_{1-x-y}Ge_xC_y$ layer. $Si_{1-y}C_y$ layer or $Si_{1-x-y}Ge_xC_y/Si_{1-y}C_y$ multi-layer structures.

Low absorption (spatially indirect optical transitions) and good wave guidance in the relevant wavelength range (1.55 mm and 1.3 mm) can be achieved through suitable choice of the compositions and layer thicknesses.

The layer thickness is not restricted because of symmetrification or compensation of the distortion.

FIG. 6 shows a photodetector 21 disposed on a chip 22 and having a V-shaped groove 24 in which there is secured the end 26 of an optical fiber 28. Light transmitted along the optical fiber 28 passes into the photodetector 21 and is detected there. The output signal from the photodetector can be processed by other components such as amplifier 30 and counter 32 provided on the same chip, i.e. realized using Si technology in the known manner. The output from the counter 32 is transmitted to a display 34. The amplifier 30, counter 32 and display 34 are simply given as an example.

Figure 7:
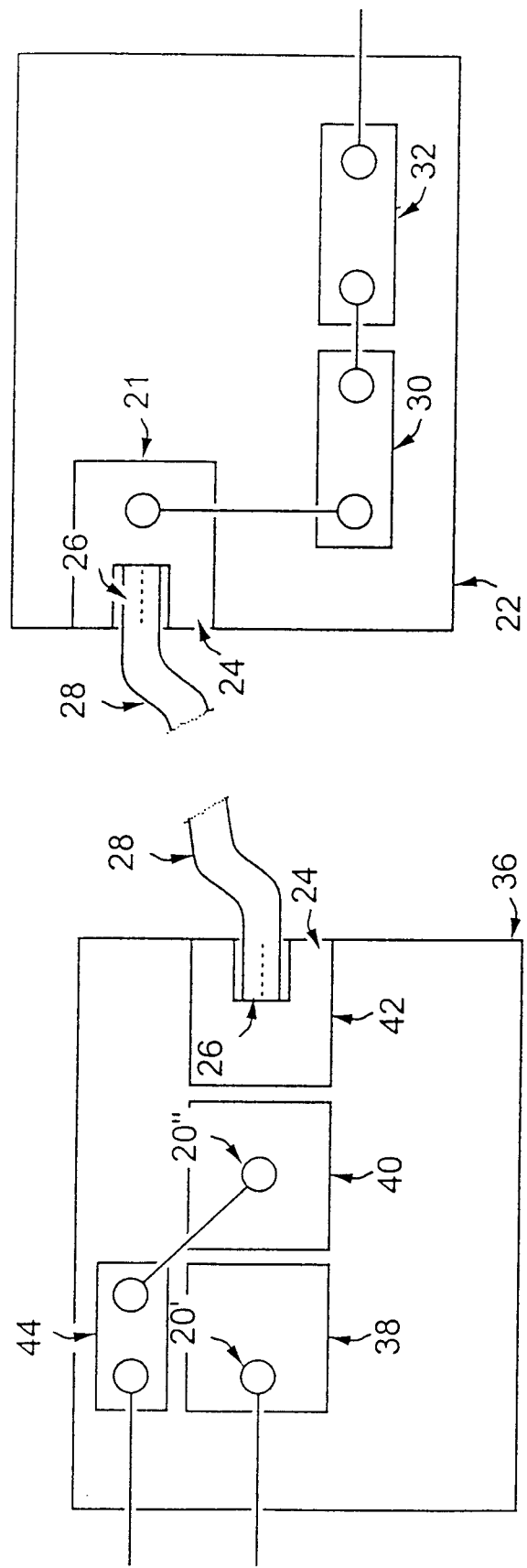

FIG. 7 shows two chips 36, 32 connected together by an optical fiber 28. The first chip 36 is a silicon chip having a light emitting diode 38, an optical modulator 40 and an optical waveguide 42 in accordance with the present invention. The optical waveguide feeds the modulated signal from the light emitting diode into the optical fiber which conducts it to be photodetector 21 and chip 22 for detection. In the same way as before the chip 22 has other components 30 and 32. Chip 36 can also have other components, such as 44 which generates the modulation signals applied to the optical modulator 40.

It will be understood that although this specification refers to p- and n-substrates doped at doping concentrations of about $10^{18}$ cm$^{-3}$, it is sufficient to use undoped substrates or substrates doped in any desired manner and to ensure the required p- and n-doping for the purposes of the present invention in a relatively thin upper surface layer of the substrate, e.g. in a layer of one μm or less, and references to p- and n-substrates in the claims are to be understood to include such substrates.

Figure 8:
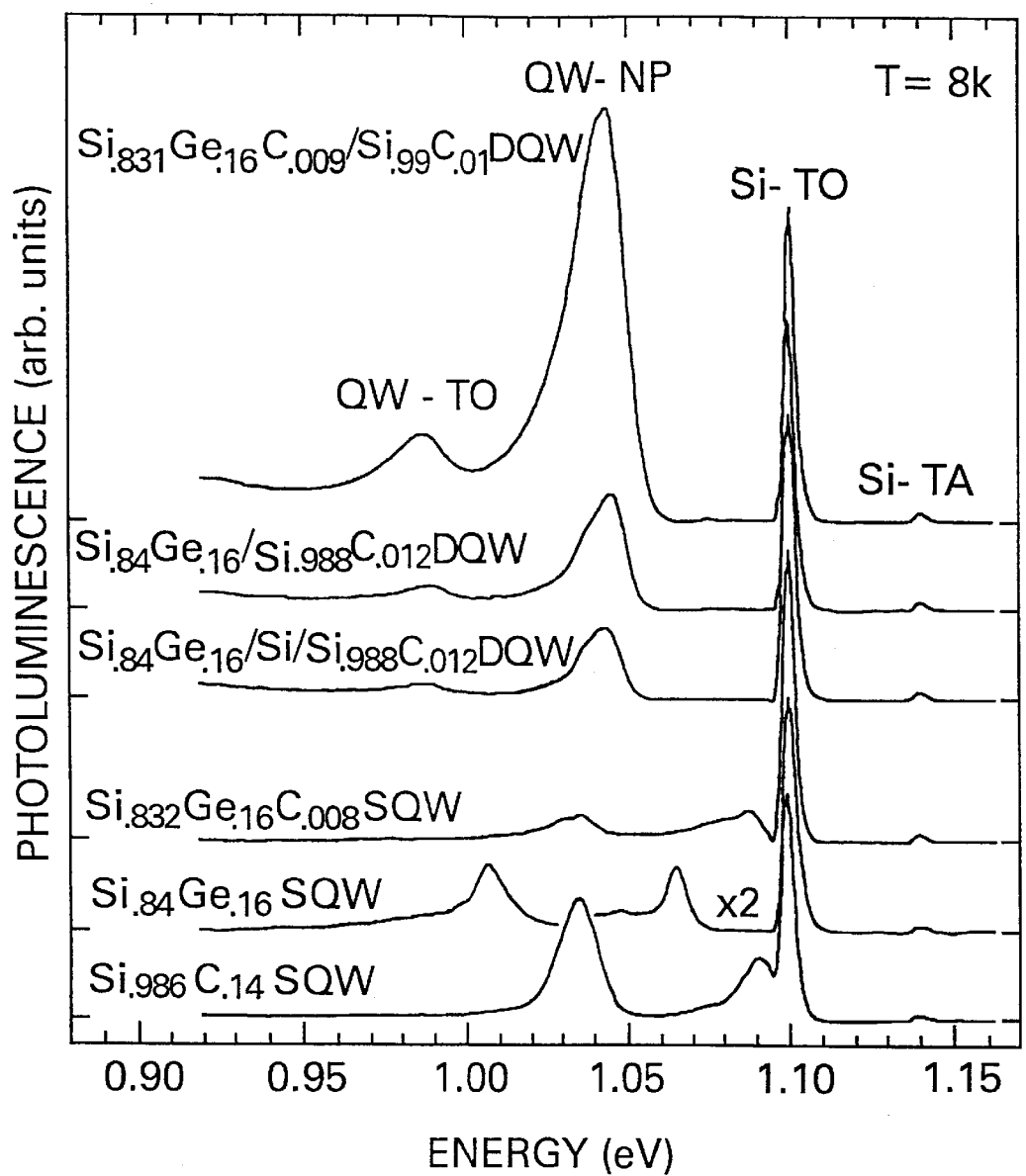

The results of some practical investigations will now be given with reference to FIGS. 8 to 11. The plots shown in these Figures provide useful design information for persons wishing to practice the present invention. In detail the FIGS. 8 to 11 show the following:

FIG. 8 Low temperature PL spectra of 25-period multiple layer structures containing SQW's and DQW's in a Si matrix. $Si_{0.84}Ge_{0.16}$ and $Si_{0.84}Ge_{0.16}C_y$ are 40 Å and $Si_{1-y}C_y$ layers 33 Å in width. The composition are given in the figure. The excitonic no-phonon and TO-phonon PL lines originating from alloy layers are marked by NP-QW and TO-QW, respectively.

Figure 9:
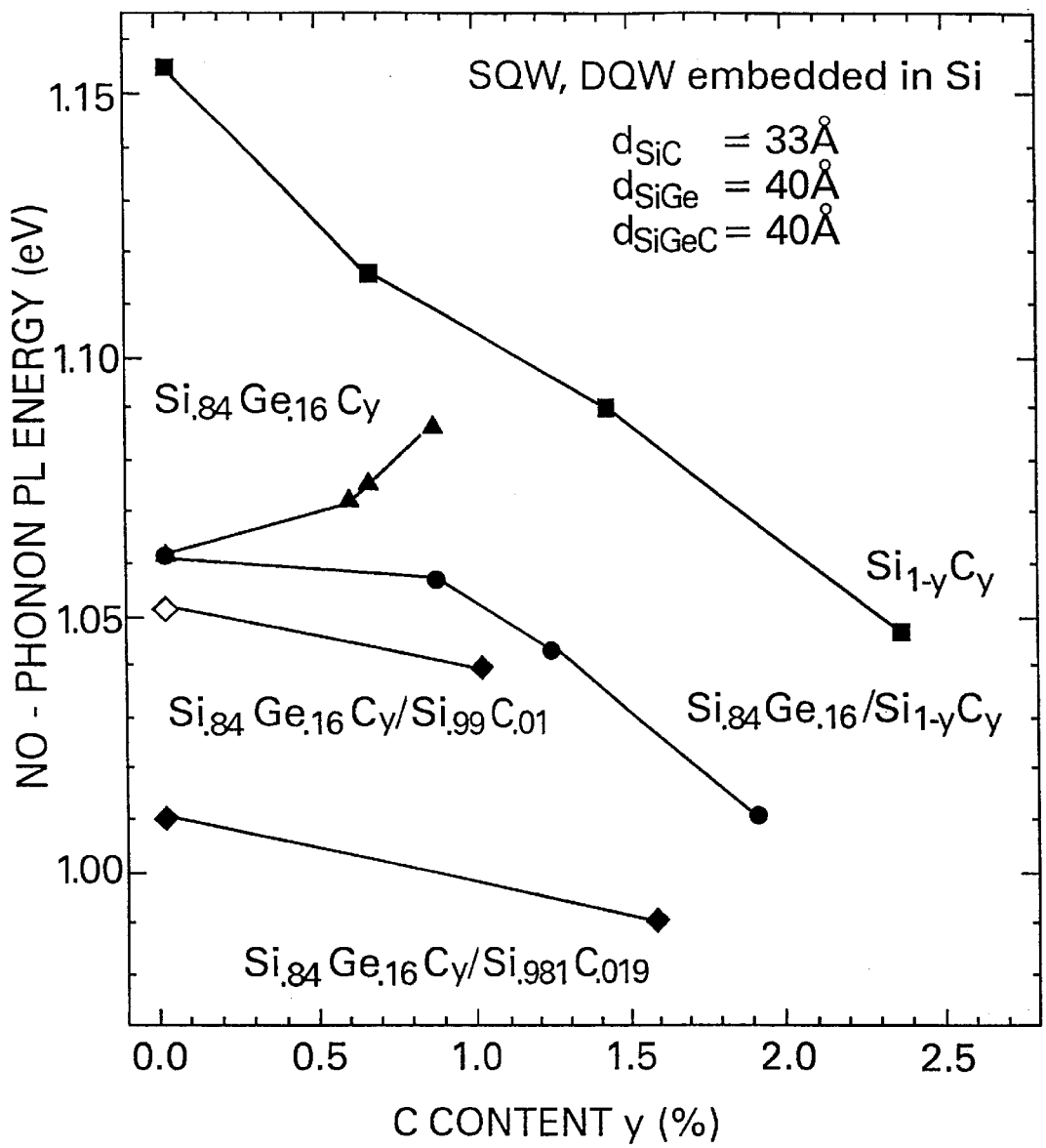

FIG. 9 Energy of the no-phonon PL line observed from $Si_{1-y}C_y$ and $Si_{0.84}Ge_{0.16}C_y$ SQW and from $Si_{0.84}Ge_{0.16}/Si_{1-y}C_{y'}$ and $Si_{0.84}Ge_{0.16}C_y/Si_{1-y}C_{y'}$ DQW structures versus C content y. Layers with and without Ge (x=16%) are 40 Å and 33 Å in width, respectively.

Figure 10:
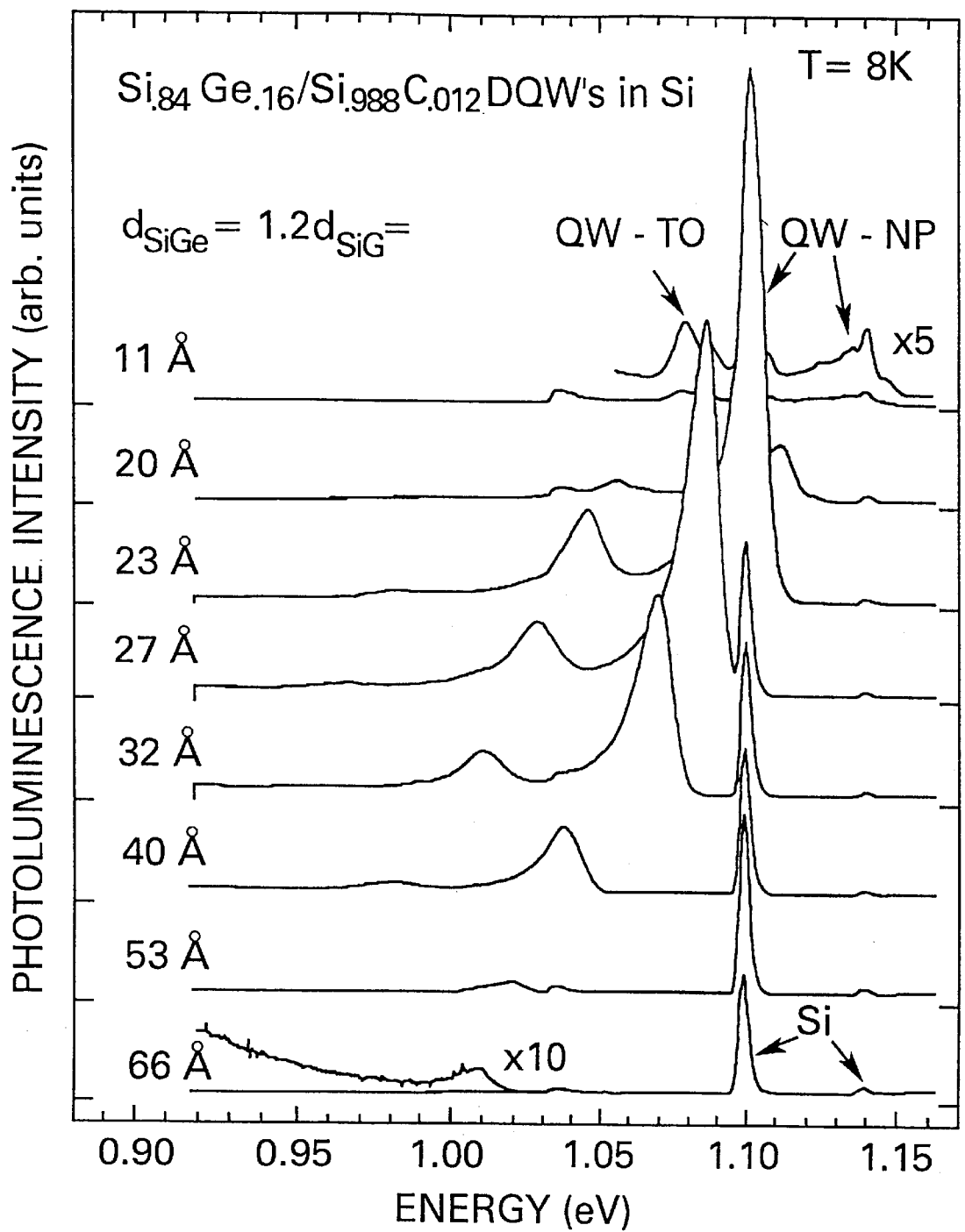

FIG. 10 PL spectra from $Si_{0.84}Ge_{0.16}/Si_{0.988}C_{0.012}$ DQW structures with varied layer widths $d_{SiGe}$=1.2 $d_{SiC}$ in Si. The spectra are plotted on the same intensity scale with offsets for clarity.

FIG. 11 Energy (○) and integrated intensity (●) of the no-phonon PL line originating from $Si_{0.84}Ge_{0.16}/Si_{0.988}C_{0.012}$ DQW's embedded in Si depending on width $d_{SiGe}$=1.2 $d_{SiC}$. The dashed line represents the results of model calculations for the lowest CB and topmost VB states using $\Delta V_{A(2)}$=x·0.5 eV-y·5.2 eV and $\Delta V_{hh}$=x·0.74 eV-y·3.2 eV. Calculated subband states for $d_{SiGe}$=40 Å are illustrated in the inset. The smooth solid line represents an exponential function $\exp(-d_{SiGe}/8.2$ Å) which fits to the intensity data observed for $d_{SiGe} \geq 27$ Å.

In the last years, the photoluminescence (PL) properties of $Si_{1-x}Ge_x$ quantum well (QW) and Si/Ge superlattice (SL) structures have been extensively studied [1–3]. Enhanced efficiencies of the PL transitions which are indirect in k-space were proposed for SL structures due to zone folding effects and symmetry braking of states at Si/Ge interfaces [4]. Intense PL at room temperature was observed from deep $Si_{1-x}Ge_x$ QW's embedded in Si and from thin Ge/Si/Ge coupled QW's in $Si_{1-x}Ge_x$ [5,6]. The conduction band-edge of $\Delta(4)$ electrons within pseudomorphic $Si_{0.85}Ge_{0.15}$ QW's on Si was shown by Houghton et al. [7] to be more than 10 meV lower in energy than in Si. Thus spatially direct (type I) PL transitions are observed from such QW's. All the results imply that the height of potential barriers confining electrons and holes and the sample quality also strongly affect PL efficiency. Recently, novel $Si_{1-y}C_y$/Si QW structures have been realized by molecular beam epitaxy (MBE) which reveal distinct band-edge related PL at low temperature [8]. The fundamental properties of pseudomorphic $Si_{1-y}C_y$ layers on Si turn out to be tensile strain as large as $\epsilon=0.35y$ [9] and a resulting electron valley splitting with a strong lowering of the twofold degenerate $\Delta(2)$ electron minima. Considering the large modulation of the Si conduction band-edge of about $\Delta E_{\Delta(2)}=-y(5.2\ eV)$ even by small amounts of C, a multitude of possibilities in band structure design is proposed for the ternary SiGeC alloy system. In this discussion a report will be made on PL studies of pseudomorphic $Si_{1-x}Ge_x/Si_{1-y}C_y$ and $Si_{1-x-y}Ge_xC_y/Si_{1-y'}C_{y'}$ double QW (DQW) structures embedded in Si. The no-phonon PL line related to the effective band-edge is strongly enhanced in intensity and is attributed to spatially indirect (type II) transitions of electrons confined to the $Si_{1-y}C_y$ layers and holes confined to the neighboring $Si_{1-x}Ge_x$ layers. This is confirmed by the dependence of PL energy and intensity on composition and width of DQW layers in comparison with $Si_{1-y}C_y$, $Si_{1-x}Ge_x$ and $Si_{1-x-y}Ge_xC_y$ SQW's. The feasibility of PL from DQW's for determining $Si_{1-x-y}Ge_xC_y$ conduction (GB) and valence band (VB) offsets depending on C and Ge content is demonstrated.

All samples discussed here are grown by molecular beam epitaxy on Si (001) substrates at constant growth temperature $T_s=600°$ C. At this temperature, $Si_{1-y}C_y$, $Si_{1-x}Ge_x$ as well as $Si_{1-x-y}Ge_xC_y$ QW layers reveal band-edge PL, even though optimum PL properties of $Si_{1-y}C_y$ and $Si_{1-x}Ge_x$ are observed at about $T_s=550°$ C. and 750° C., respectively. Si is supplied by an electron beam evaporator, Ge is evaporated by an effusion cell and C is sublimated from a pyrolitic graphic filament. The Si, Ge, and C growth rates are about 1.0, 0.2, and 0.01–0.02 Å/s, respectively. Each sample consists of a 25-period multiple layer structure which is deposited on a 4000 Å Si buffer layer and is capped by 500 Å Si. In each period of about 240 Å width a SQW or DQW is embedded in Si layers. Typical widths of $Si_{1-y}C_y$ and $Si_{1-x-y}Ge_xC_y$ layers are 33 Å and 40 Å, respectively. The composition and width of the layers are deduced very accurately (±10%) from X-ray rocking curves and their numerical simulation. For this, the validity of Vegard's law and linearly interpolated elastic properties of the alloys are assumed. The notation $Si_{0.84}Ge_{0.16}C_y$ refers to $(Si_{0.84}Ge_{0.16})_{1-y}C_y$ alloys. PL is excited by a blue laser beam of about 0.3 W/cm² in excitation density. PL is analyzed by a single grating spectrometer with a Ge detector using standard lock-in techniques. The samples are mounted on a cold-finger of a He-flow cryostat at about T=8 K.

The lower part of FIG. 7 shows PL spectra from three types of SQW's embedded in Si. Besides the TO phonon replica line at energy E=1.1 eV originating from thick Si layers, no-phonon and TO phonon lines of carriers confined to the $Si_{0.988}C_{0.012}$, $Si_{0.84}Ge_{0.16}$ or $Si_{0.832}Ge_{0.16}C_{0.008}$ SQW's are observed at lower energy. Both lines are comparable in intensity for all SQW's. In $Si_{1-y}C_y$ SQW's, the energy of the twofold degenerate $\Delta(2)$ electron valleys directed in growth direction is strongly lowered and the light hole (hl) VB energy seems to be slightly increased. These results were deduced from detailed PL studies described in [8] and are qualitatively understood considering the large tensile strain $\epsilon=0.35y$ induced by substitutional C. Tensile strain results in a CB shift of about $\Delta E_{\Delta(2)}\approx-y(4.6\ eV)$ assuming Si deformation potentials. A VB offset for heavy hole (hh) states of about $E_{hh}=x(0.74\ eV)$ and a weak energy lowering for the downmost $\Delta(4)$ electron states in $Si_{1-x}Ge_x/Si$ QW's were convincingly observed by several groups [2,8]. PL from a $Si_{0.832}Ge_{0.16}C_{0.008}$ SQW is shifted to about 20 meV higher energy compared to a $Si_{0.84}Ge_{0.16}$SQW. A C content of 0.8% reduces compressive strain from $\epsilon=-0.64\%$ to $-0.36\%$. The strain-induced increase and a minor intrinsic lowering of the band gap have been assigned for the blueshift of PL from $Si_{1-x-y}Ge_xC_y$ SQW's with C allowing [10]. All PL lines from SQW's are considered to represent spatially direct recombination of electron and hole states confined to the alloy layers. A qualitatively different band alignment is realized in $Si_{1-x}Ge_x/Si_{1-y}C_y$ DQW's in Si. The PL observed from 40 Å $Si_{0.84}Ge_{0.16}$ (or $Si_{0.832}Ge_{0.16}C_{0.008}$) and 33 Å $Si_{0.988}C_{0.012}$ layers which are deposited in close proximity or with a thin 4 Å Si layer in between are shown in the upper part of FIG. 8. The DQW's reveal PL lines at lower energy than all the SQW's. They are attributed to spatially indirect transitions of $\Delta(2)$ electron and heavy hole states localized within neighboring $Si_{0.988}C_{0.012}$ and $Si_{0.84}Ge_{0.16}$ QW layers. The no-phonon line is enhanced and about 7 times higher in intensity than the TO phonon line. The intensity gain observed for DQW's compared to SQW's is remarkable, as a strong reduction might be expected for a switching from spatially direct to indirect transitions. A strong dependence of DQW PL on the spatial separation of electron and hole states is illustrated by the 40% decrease in intensity observed from a DQW structure with the two QW's separated by a thin 4 Å Si (barrier) layer. Additional C alloying of the $Si_{0.84}Ge_{0.16}$ layers in a DQW structure results in a further enhanced PL intensity and a slightly reduced PL energy (topmost spectra in FIG. 1).

The no-phonon peak energy observed from several SQW and DQW structures with varied C content and constant layer widths of 33 Å (or 40 Å for Ge alloy layers with x=16%) are summarized in FIG. 9. $Si_{1-y}C_y$ SQW's reveal a nearly linear PL redshift of about $\Delta E_{NP}=-y(4.5\ eV)$. The same redshift is observed from coupled $Si_{0.84}Ge_{0.16}/Si_{1-y}C_y$ DQW's for increasing y at values $y\geq0.8\%$. This agreement verifies that the main part of band gap reduction in $Si_{1-y}C_y$ is due to a lowering of the CB, as the hole states of DQW's emitting PL are located within the $Si_{0.84}Ge_{0.16}$ layers at a constant energy level. The PL energy from DQW's is lower than that from $Si_{0.84}Ge_{0.16}$ SQW's for $y\geq0.8\%$. A crossing of $\Delta(4)$ states in $Si_{0.84}Ge_{0.16}$ and $\Delta(2)$ states in $Si_{1-y}C_y$ seems to happen at y=0.8%. The energy levels probed by PL are influenced by the confinement energies which shift slightly with barrier height and by excitonic binding which is difference in SQW's and SQW's. The strain situation as well as the band-edge shifts are different in $Si_{0.84}Ge_{0.16}C_y$ SQW's. The observed PL blueshift of about $\Delta E_{NP}=y(2.4\ eV)$ agrees well with the results of Amour et al. [10]. Assuming a type I band alignment in $Si_{1-x}Ge_x/Si$ QW's, it results from an intrinsic influence of C on the $S_{1-x}Ge_x$ band gap and from the $\Delta(4)$ electron and hh band-edge shifts caused by strain compensation, which opens the band gap. A PL redshift of about $\Delta E_{NP}=-y(1.0\ eV)$ is observed from $Si_{0.84}Ge_{0.16}C_y$ layers neighboring a $Si_{1-y'}C_{y'}$ layer with respect to corresponding $Si_{0.84}Ge_{0.16}/Si_{1-y'}C_{y'}$ DQW structures. It can be assigned to an increase of the hh VB offset in a 40 Å $Si_{0.84}Ge_{0.16}C_y$ QW by C allowing relative to Si. This VB shift is driven by intrinsic SiGeC properties and not by strain. It qualitatively agrees with a localization of light holes within $Si_{1-y}C_y$ layers [8]. In principle, the energy shift of PL with C content y in $Si_{0.84}Ge_{0.16}/Si_{1-y}C_y$ and $Si_{0.84}Ge_{0.16}C_y/Si_{1-y'}C_{y'}$ DQW's reflect the shift of the $\Delta(2)$ CV in Si and hh VB in $Si_{0.84}Ge_{0.16}$ to lower and higher energy, respectively. It should be noted, however, that confinement effects, a modified excitonic binding energy in DQW's, sample inhomogeneities, and impurities may affect the quantitative band-edge shifts with C given in FIG. 9.

PL spectra from a series of $Si_{0.84}Ge_{0.16}/Si_{0.988}C_{0.012}$ DQW samples with varied layer widths $d_{SiGe}=1.2d_{SiC}$ are illustrated in FIG. 10. The energy and integrated intensity of the no-phonon PL line are plotted vs. $d_{SiGe}$ in FIG. 11. By decreasing the layer widths from $d_{SiGe}$=66 Å to 11 Å, PL shifts monotonically from $E_{NP}$=1.008 eV to 1.134 eV, which is only 20 meV below the excitonic band-edge of Si. This blueshift represents the sum of confinement energy shifts of electrons and holes within the $Si_{0.84}Ge_{0.16}$ and $Si_{0.988}C_{0.12}$ QW's. Concomitant with the blueshift, PL intensity increases exponentially Int~exp(-$d_{SiGe}$/8.2 Å) by more than two orders of magnitude until it drops for $d_{SiGe} \leq 20$ Å. Such a strong increase of intensity with decreasing layer width is not observed for SQW's [3,8]. It reflects an enhancement of the PL transition rate, assuming fast recombination channels competing with PL. The PL energy shift and the squared Δ(2)·hh overlap integral which is expected to dominate the PL recombination rate have been calculated in a single particle approximation. Effective masses $m_{\Delta(2)}$=0.92 $m_o$, $m_{hh}$=0.275 $m_o$ and a CB and VB alignment as sketched in the inset of FIG. 11 are assumed. Δ(2) and hh states are rejected by potential barriers from the $Si_{0.84}Ge_{0.16}$ and $Si_{0.988}C_{0.12}$ layers due to their compressive and tensile strain, respectively. The model calculations reveal an energy shift and an increase in PL transition rate of about Int·exp (-$d_{SiGe}$/11 Å) which describe reasonably well the results observed. A constant ratio of no-phonon and TO phonon line intensity implies that mixing of Γ and Δ(2) electron states caused by alloying depends little on layer width [4]. Strong no-phonon contributions and an enhanced integrated intensity show that the mixing in DQW's is more efficient than in SQW's. The modulation of strain switches from compressive to tensile and also the chemical properties change significantly at the $Si_{1-x}Ge_x/Si_{1-y}C_y$ DQW interfaces. Some further experimental results can be qualitatively understood by regarding the overlap of Δ(2) and hh states: The drop of PL intensity observed for $d_{SiGe} \leq 20$ Å is attributed to the loss of carrier localization within thin DQW's and a resulting small overlap of states. C alloying of $Si_{0.84}Ge_{0.16}$ layers in DQW structures reduces strain and the Δ(2) barrier height in $Si_{0.832}Ge_{0.16}C_{0.008}$. The Δ(2)-hh overlap and PL intensity increase as observed in the topmost spectra of FIG. 8. A decreasing PL intensity is observed for increasing the Ge and C content at constant layer width $d_{SiGe}$=40 Å. This is explained by a smaller leakage of states for deeper wells.

In conclusion, an improved PL efficiency of $Si_{1-x-y}Ge_xC_y/Si_{1-y}C_y$ DQW's embedded in Si is observed compared to SQW's. This enhancement is quite remarkable, considering the small overlap of carrier wavefunctions which is calculated to be only about 11% in the 27 Å $Si_{0.84}Ge_{0.16}$/23 Å $Si_{0.989}C_{0.011}$ DQW structure revealing maximum PL intensity so far. Considerably higher PL transition rates result for short-period $Si_{1-x-y}Ge_xC_y/Si_{1-y}C_y$ superlattice structures. Further enhanced no-phonon transitions and efficient capture of excited carriers even at room temperature may be expected for larger Ge and C contents. More sophisticated calculations on such structures are required. It should be mentioned, that $Si_{0.84}Ge_{0.16}/Si_{0.981}C_{0.019}$ and $Si_{0.831}Ge_{0.16}C_{0.009}/Si_{0.99}C_{0.01}$ DQW's studied here, for example, are nearly compensated in average strain. Superlattices even of large total thickness should suffer no strain relaxation. This may promise future waveguide, infrared detector, modulator, and electroluminescence devices applying such Si-based structures.

REFERENCES

1. R. Zachai, K. Eberl, G. Abstreiter, E. Kasper, and H. Kibbel, Phys. Rev. Lett. 64, 1055 (1990).

2. J. C. Sturm, H. Manoharan, L. C. Lenchyshyn, M. L. W. Thewalt, N. L. Rowell, J.-P. Noel, and D. C. Houghton, Phys. Rev. Lett. 66, 1362 (1991).

3. F. Schäffler, M. Wachter, H. J. Herzog, K. Thonke, and R. Sauer, J. Cryst. Growth 127, 411 (1993).

4. I. Morrison and M. Jaros, Phys. Rev. B 37, 916 (1988).

5. S. Fukatsu, N. Usami, and S. Shiraki, Appl. Phys. Lett. 63, 967 (1993).

6. M. Gail, G. Abstreiter, J. Olajos, J. Engvall, H. Grimmeis, H. Kibbel, and H. Presting, Appl. Phys. Lett. 66, 2978 (1995).

7. D. C. Houghton, G. C. Aers, S.-R. Eric Yang, E. Wang, and N. L. Rowell, Phys. Rev. Lett. 75, 866 (1995).

8. K. Brunner, K. Eberl, and W. Winter, Phys. Rev. Lett. 76, 303 (1996).

9. S. S. Iyer, K. Eberl, M. S. Goorsky, F. K. LeGoues, J. C. Tsang, and F. Cardone, Appl. Phys. Lett. 60, 356 (1992).

10. A. St. Amour, C. W. Liu, J. C. Sturm, Y. Lacroix, and M. L. W. Thewalt, Appl. Phys. Lett. 67, (1995).

What is claimed is:

1. A semiconductor component, selected from the group comprising a photodetector, a light emitting diode, an optical modulator, and a waveguide, the semiconductor component being configured for operation in the wavelength range from 1.3 μm to 1.55 μm and comprising an Si substrate, an active region formed on said substrate, and an Si capping layer on said active region, wherein said active region comprises one of the following layer structures:

a) a superlattice comprising a plurality of periods of alternating layers of $Si_{1-y}C_y$ and $Si_{1-x-y}Ge_xC_y$ with the atomic fraction y of the $Si_{1-x-y}Ge_xC_y$ layers being not equal to zero and being different from the atomic fraction y of the $Si_{1-y}C_y$ layers, the atomic fraction y of the $Si_{1-y}C_y$ layers being not equal to zero;

b) a superlattice comprising a plurality of periods of a three-layer structure comprising Si, $Si_{1-y}C_y$ and $Si_{1-x}Ge_x$ layers, the atomic fraction y of the $Si_{1-y}C_y$ layers being not equal to zero; and c) a superlattice comprising a plurality of periods of a three-layer structure comprising Si, $Si_{1-y}C_y$ and $Si_{1-x-y}Ge_xC_y$ layers, with the atomic fraction y of the $Si_{1-x-y}Ge_xC_y$ layers being not equal to zero and being different from the atomic fraction y of the $Si_{1-y}C_y$ layers, the atomic fraction y of the $Si_{1-y}C_y$ layers being not equal to zero;

wherein x of Ge ranges from six to twenty times y of C in the $Si_{1-x-y}Ge_xC_y$ layers and y of C in the $Si_{1-x-y}Ge_xC_y$ layers ranges from 0% to 12%; and wherein y of C in the $Si_{1-y}C_y$ layers ranges from 0.02 to 0.12 and is different from y of C in the $Si_{1-x-y}Ge_xC_y$ layers.

2. A semiconductor component in accordance with claim 1, wherein the atomic fractions x of Ge and y of C in the $Si_{1-x-y}Ge_xC_y$ layers is selected so that the lattice constant is largely matched to that of an adjacent Si layer.

3. A semiconductor component in accordance with claim 1, wherein the atomic fraction y of C in the $Si_{1-y}C_y$ layers lies in the range from 0.02 to 0.12 and is different from the atomic fraction y of C in the $Si_{1-x-y}Ge_xC_y$ layers.

4. A semiconductor component in accordance with claim 1, wherein the thickness of the $Si_{1-x-y}Ge_xC_y$ layers lies in the range from about 0.5 to about 10 nm and the thickness of the $Si_{1-y}C_y$ layers lies in the same range.

5. A semiconductor component in accordance with claim 4, wherein the thickness of the $Si_{1-x-y}Ge_xC_y$ layers differs from the thickness of the $Si_{1-y}C_y$ layers.

6. A semiconductor component in accordance with claim 1, wherein the atomic fraction y and the thickness of the $Si_{1-y}C_y$ layers and the atomic fractions x and y and the thickness of the $Si_{1-x-y}Ge_xC_y$ layers are chosen to produce a compensated structure, comprising a structure with a low average strain below the level at which substantial defects arise in the semiconductor component due to strain relaxation.

7. A semiconductor component in accordance with claim 1, wherein said superlattice structure comprises 10 to 100 periods of the repeating layer structures.

8. A semiconductor component in accordance with claim 7, wherein said superlattice structure comprises 20 to 80 periods of the repeating layer structure.

9. A semiconductor component in accordance with claim 9, wherein said superlattice structure comprises about 50 periods of the repeating layer structure.

10. A semiconductor component in accordance with claim 1 variant c), wherein the atomic fraction y and the thickness of the $Si_{1-y}C_y$ layers and the atomic fraction x and the thickness of the $Si_{1-x}Ge_x$ layers are chosen so that the average value of the lattice constant of the layer structure of the active region corresponds to that of Si.

11. A semiconductor component in accordance with claim 1 variant c), wherein the atomic fraction y of C in the $Si_{1-y}C_y$ layers lies in the range from 0.02 to 0.12 and is different from the atomic fraction x of Ge in the $Si_{1-x}Ge_x$ layers, x lying in the range from 0.3 to 1.0.

12. A semiconductor component in accordance with claim 1 variant c), wherein the thickness of the $Si_{1-x}Ge_x$ layers lies in the range from about 0.5 to about 10 nm and the thickness of the $Si_{1-y}C_y$ layers lies in the same range.

13. A semiconductor component in accordance with claim 12, wherein the thickness of the $Si_{1-x}Ge_x$ layers differs from the thickness of the $Si_{1-y}C_y$ layers.

14. A semiconductor component in accordance with claim 1, wherein the $Si_{1-y}C_y$, $Si_{1-x}Ge_x$ and $Si_{1-x-y}Ge_xC_y$ layers are substantially undoped.

15. A semiconductor component in accordance with claim 1 in the form of an optical detector, wherein said substrate comprises a p-Si substrate to which a first contact forming a negative pole is provided and said capping layer comprises an n-Si layer to which a second contact forming a positive pole is provided.

16. A semiconductor component in accordance with claim 1 in the form of an optical detector, wherein said substrate comprises an n-Si substrate, to which a first contact forming a positive pole is provided and said capping layer comprises p-Si, to which a second contact forming a negative pole is provided.

17. A semiconductor component in accordance with claim 1 in the form of a light emitting diode, wherein said substrate comprises an n-Si substrate, to which a first contact forming a negative pole is provided and said capping layer comprises p-Si, to which a second contact forming positive pole is provided.

18. A semiconductor component in accordance with claim 1 in the form of a light emitting diode, wherein said substrate comprises a p-Si substrate, to which a first contact forming a positive pole is provided and said capping layer comprises n-Si, to which a second contact forming a negative pole is provided.

19. A semiconductor component in accordance with claim 1 and realized in the form of an optical modulator, wherein said substrate comprises a p-Si substrate, to which a first contact forming one of a negative pole is provided and said capping layer comprises n-Si, to which a second contact forming a positive pole is provided.

20. A semiconductor component in accordance with claim 1 and realized in the form of an optical modulator, wherein said substrate comprises an n-Si substrate, to which a first contact forming a positive pole is provided and said capping layer comprises p-Si, to which a second contact forming a negative pole is provided.

21. A semiconductor component in accordance with claim 1 when realized as an optical wave-guide.

22. A semiconductor device comprising a silicon substrate having a plurality of semiconductor components in accordance with claim 1 formed thereon.

23. A semiconductor device in accordance with claim 21, wherein one or more signal processing or generating circuits are formed on said substrate.

24. A semiconductor component in accordance with claim 1, wherein a blind channel is formed in said component of device and has an end face transverse to an elongate direction of said channel and formed by a side face of said active region of said component, said channel being adapted to receive at least one optical fiber end for coupling at least one optical fiber to said component.

25. A semiconductor component in accordance with claim 26, wherein the atomic fraction x of Ge is varied within the respective layer thickness.

26. A semiconductor component in accordance with claim 25, wherein the atomic fraction y of C is varied within the repeating layer thickness.

27. A semiconductor component in accordance with claim 1, wherein the atomic fraction x of the Ge amounts to about eight times the atomic fraction y of C in the $Si_{1-x-y}Ge_xC_y$ layers.

28. A semiconductor component in accordance with claim 1, wherein the atomic fraction y of C in the $Si_{1-x-y}Ge_xC_y$ layers is about 5%.

29. A semiconductor component in accordance with claim 1, wherein said substrate comprises one of
 a) an n-Si substrate doped with at least one of phosphorus and antimony at a doping concentration of the order of magnitude of $10^{18}$ cm$^{-3}$ and
 b) a p-Si substrate doped with boron at a doping concentration of the order of magnitude of $10^{18}$ cm$^{-3}$ and
said capping layer comprises p-Si doped with boron at a doping concentration of the order of magnitude of $10^{18}$ cm$^{-3}$ when said substrate is a) and n-Si doped with at least one of phosphorus and antimony at a doping concentration of the order of magnitude of $10^{18}$ cm$^{-3}$ when said substrate is b).

30. A semiconductor component in accordance with claim 1 and realized in the form of an optical modulator, wherein said substrate comprises a p-Si substrate, to which a first contact forming a positive pole is provided and said capping layer comprises n-Si, to which a second contact forming a negative pole is provided.

31. A semiconductor component in accordance with claim 1 and realized in the form of an optical modulator, wherein said substrate comprises an n-Si substrate, to which a first contact forming a negative pole is provided and said capping layer comprises p-Si, to which a second contact forming a positive pole is provided.

32. A semiconductor component in accordance with claim 1, wherein the atomic fraction y of C is varied within the repeating layer thickness.

33. A semiconductor component, selected from the group comprising a photodetector, a light emitting diode, an optical modulator, and a waveguide, the semiconductor component being configured for operation in the wavelength range from 1.3 µm to 1.55 µm and comprising an Si substrate, an active region formed on said substrate, and an Si capping layer on said active region, wherein said active region comprises one of the following layer structures:

a) a superlattice comprising a plurality of periods of alternating layers of $Si_{1-y}C_y$ and $Si_{1-x-y}Ge_xC_y$ with the atomic fraction y of the $Si_{1-x-y}Ge_xC_y$ layers being different from the atomic fraction y of the $Si_{1-y}C_y$ layers, the atomic fraction y of at least one of the $Si_{1-y}C_y$ and $Si_{1-x-y}Ge_xC_y$ layers being not equal to zero; and b) a superlattice comprising a plurality of periods of a three-layer structure comprising Si, $Si_{1-y}C_y$, and $Si_{1-x}Ge_x$ layers with the atomic fraction y of the $Si_{1-x-y}Ge_xC_y$ layers being not equal to zero and being different from the atomic fraction y of the $Si_{1-y}C_y$ layers, the atomic fraction y of the $Si_{1-y}C_y$ layers being not equal to zero;

wherein x of Ge ranges from six to twenty times y of C in the $Si_{1-x-y}Ge_xC_y$ layers and y of C in the $Si_{1-x-y}Ge_xC_y$ layers ranges from 0% to 12%; and wherein y of C in the $Si_{1-y}C_y$ layers ranges from 0.02 to 0.12 and is different from y of C in the $Si_{1-x-y}Ge_xC_y$ layers.

* * * * *